(12) United States Patent
Kim

(10) Patent No.: US 11,227,643 B1
(45) Date of Patent: Jan. 18, 2022

(54) ELECTRONIC DEVICES CONFIGURED TO EXECUTE A BURST OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/080,059

(22) Filed: Oct. 26, 2020

(30) Foreign Application Priority Data

Jul. 16, 2020 (KR) .................... 10-2020-0088422

(51) Int. Cl.
  *G11C 7/22* (2006.01)
  *G11C 7/10* (2006.01)
  *G11C 8/18* (2006.01)

(52) U.S. Cl.
  CPC ............ *G11C 7/222* (2013.01); *G11C 7/1039* (2013.01); *G11C 7/1066* (2013.01); *G11C 7/1072* (2013.01); *G11C 7/1093* (2013.01); *G11C 8/18* (2013.01)

(58) Field of Classification Search
  CPC ......... G11C 8/18; G11C 7/222; G11C 7/1039; G11C 7/1066; G11C 7/1072; G11C 7/1093
  USPC ........................................... 36/233.1, 233.18
  See application file for complete search history.

(56) References Cited

U.S. PATENT DOCUMENTS

| 10,489,314 B2* | 11/2019 | Solomon | G06F 13/4282 |
| 10,614,871 B2* | 4/2020 | Kang | G11C 11/4087 |
| 10,901,926 B2* | 1/2021 | Kim | G11C 11/4076 |
| 11,049,533 B1* | 6/2021 | Oh | G11C 8/12 |
| 2015/0310904 A1 | 10/2015 | Kim et al. | |

FOREIGN PATENT DOCUMENTS

KR      1020090093308 A      9/2009

* cited by examiner

*Primary Examiner* — Son L Mai
(74) *Attorney, Agent, or Firm* — William Park & Associates Ltd.

(57) ABSTRACT

An electronic device includes a controller and a semiconductor device. The controller outputs a clock signal and data and successively outputs a chip selection signal and a command and address (command/address) signal for performing a write operation. The semiconductor device enters the write operation based on the chip selection signal and the command/address signal which are input in synchronization with the clock signal at a first point in time. In addition, the semiconductor device selectively performs one of a first burst operation and a second burst operation during the write operation based on the chip selection signal and the command/address signal which are input in synchronization with the clock signal at a second point in time, thereby storing the data into the semiconductor device.

23 Claims, 19 Drawing Sheets

FIG. 4

| OPERATION | CLK | CS | CA<1> | CA<2> | CA<3> | CA<4> | CA<5> | CA<6> |
|---|---|---|---|---|---|---|---|---|
| WRITE-1 | Rising | H | L | L | H | L | L | BL32 |
|  | Rising | L | BK<1> | BK<2> | BK<3> | COL<1> | COL<2> | COL<3> |
| WRITE-2 | Rising | H | L | H | L | L | H | X |
|  | Rising | L | COL<4> | COL<5> | COL<6> | COL<7> | COL<8> | COL<9> |
| READ-1 | Rising | H | L | H | L | L | L | BL32 |
|  | Rising | L | BK<1> | BK<2> | BK<3> | COL<1> | COL<2> | COL<3> |
| READ-2 | Rising | H | L | H | L | L | H | X |
|  | Rising | L | COL<4> | COL<5> | COL<6> | COL<7> | COL<8> | COL<9> |

ELECTRONIC DEVICES CONFIGURED TO EXECUTE A BURST OPERATION

CROSS-REFERENCE TO RELATED APPLICATIONS

The present application claims priority under 35 U.S.C. 119(a) to Korean Patent Application No. 10-2020-0088422, filed on Jul. 16, 2020, which is incorporated herein by reference in its entirety.

BACKGROUND

1. Technical Field

Embodiments of the present disclosure relate to electronic devices configured to execute a burst operation based on command/address signals successively input.

2. Related Art

In general, semiconductor devices such as double data rate synchronous dynamic random access memory (DDR SDRAM) devices perform a read operation and a write operation according to commands provided by an external chip set device. In order that the semiconductor devices perform the read operation or the write operation, each of the semiconductor devices must perform an active operation. The semiconductor devices may successively receive a command and an address through a command/address pin to generate an active command and an internal address for performing the active operation and may separate the command from the address using a chip selection signal.

Meanwhile, the semiconductor devices are designed to support a burst operation, and the burst operation means an operation that determines a length (i.e., a burst length) of data which are input to or output from the semiconductor device during one write operation or one read operation. For example, the semiconductor devices are designed to support an operation for receiving and outputting 16-bit data and an operation for receiving and outputting 32-bit data during the burst operation.

SUMMARY

According to an embodiment, an electronic device may include a controller and a semiconductor device. The controller may be configured to output a clock signal and data and is configured to successively output a chip selection signal and a command/address signal for performing a write operation. The semiconductor device may be configured to enter the write operation based on the chip selection signal and the command/address signal which are input in synchronization with the clock signal at a first point in time. The semiconductor device may be configured to selectively perform one of a first burst operation and a second burst operation during the write operation based on the chip selection signal and the command/address signal which are input in synchronization with the clock signal at a second point in time, thereby storing the data into the semiconductor device.

According to another embodiment, an electronic device may include a command control circuit and a column control circuit. The command control circuit may be configured to receive an internal chip selection signal and an internal command/address signal to generate a write command pulse for performing a write operation, a first write control signal for performing a first burst operation, and a second write control signal for performing a second burst operation. The column control circuit may be configured to generate a first write enablement signal which is enabled during the write operation based on the write command pulse and the first write control signal. The column control circuit may be configured to generate a second write enablement signal which is selectively enabled during the write operation based on the write command pulse and the second write control signal.

BRIEF DESCRIPTION OF THE DRAWINGS

FIG. 4 is a table illustrating logic levels of a chip selection signal and a command/address signal for performing a write operation and a read operation according to an embodiment of the present disclosure.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, and vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments of the present disclosure will be described hereinafter with reference to the accompanying drawings. However, the embodiments described herein are for illustrative purposes only and are not intended to limit the scope of the present disclosure.

Figure 1:
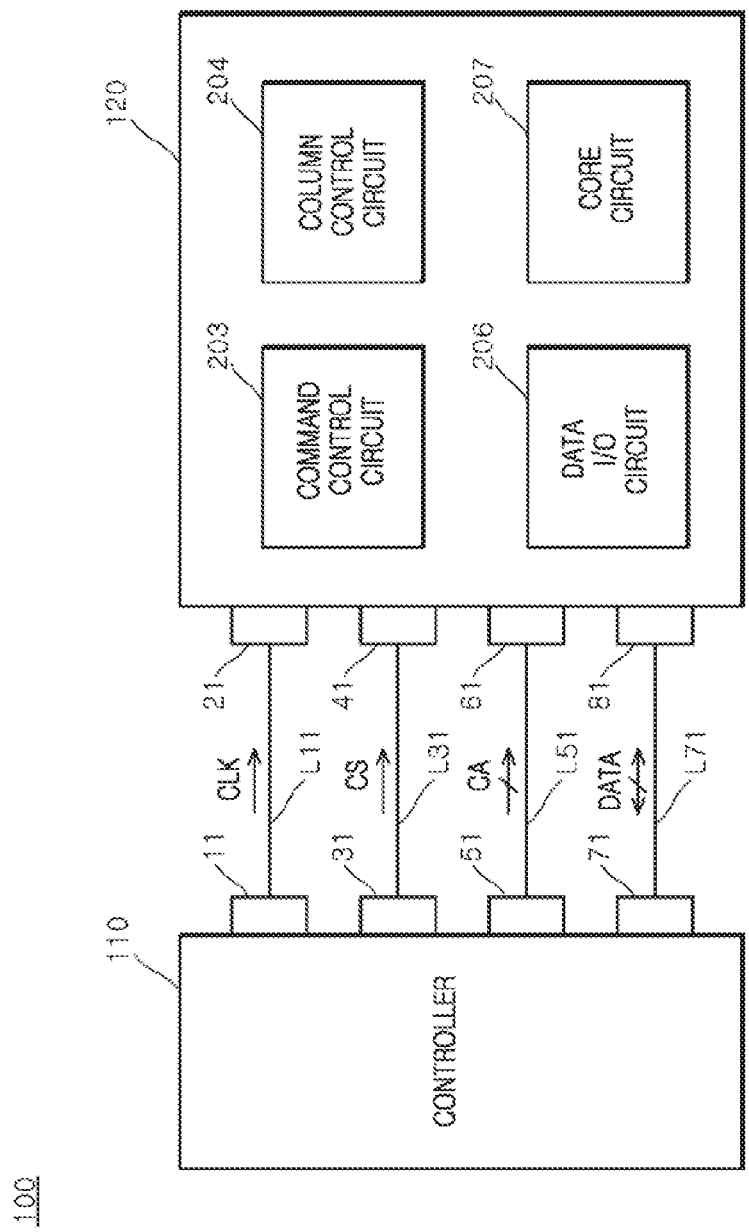
FIG. 1 is a block diagram illustrating a configuration of an electronic device according to an embodiment of the present disclosure.

As illustrated in FIG. 1, an electronic device 100 executing a burst operation according to an embodiment may include a controller 110 and a semiconductor device 120. The semiconductor device 120 may include a command control circuit 203, a column control circuit 204, a data input/output (I/O) circuit 206, and a core circuit 207.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. The first control pin 11 and the first semiconductor pin 21 may be connected to each other by a first transmission line L11. The second control pin 31 and the second semiconductor pin 41 may be connected to each other by a second transmission line L31. The third control pin 51 and the third semiconductor pin 61 may be connected to each other by a third transmission line L51. The fourth control pin 71 and the fourth semiconductor pin 81 may be connected to each other by a fourth transmission line L71, The controller 110 may transmit a clock signal CLK to the semiconductor device 120 through the first transmission line L11 to control the semiconductor device 120. The controller 110 may transmit a chip selection signal CS to the semiconductor device 120 through the second transmission line L31 to control the semiconductor device 120. The controller 110 may transmit a command/address signal CA to the semiconductor device 120 through the third transmission line L51 to control the semiconductor device 120. The controller 110 may receive data DATA from the semiconductor device 120 or may transmit the data DATA to the semiconductor device 120, through the fourth transmission line L71.

The controller 110 may output the clock signal CLK, the chip selection signal CS, the command/address signal CA, and the data DATA to the semiconductor device 120 to perform a write operation. The controller 110 may output the clock signal CLK, the chip selection signal CS, and the command/address signal CA to the semiconductor device 120 to perform a read operation. The controller 110 may receive the data DATA from the semiconductor device 120 during the read operation. The chip selection signal CS and the command/address signal CA may be successively output from the controller 110 in synchronization with an odd pulse of an even pulse included in the clock signal CLK.

Figure 2:
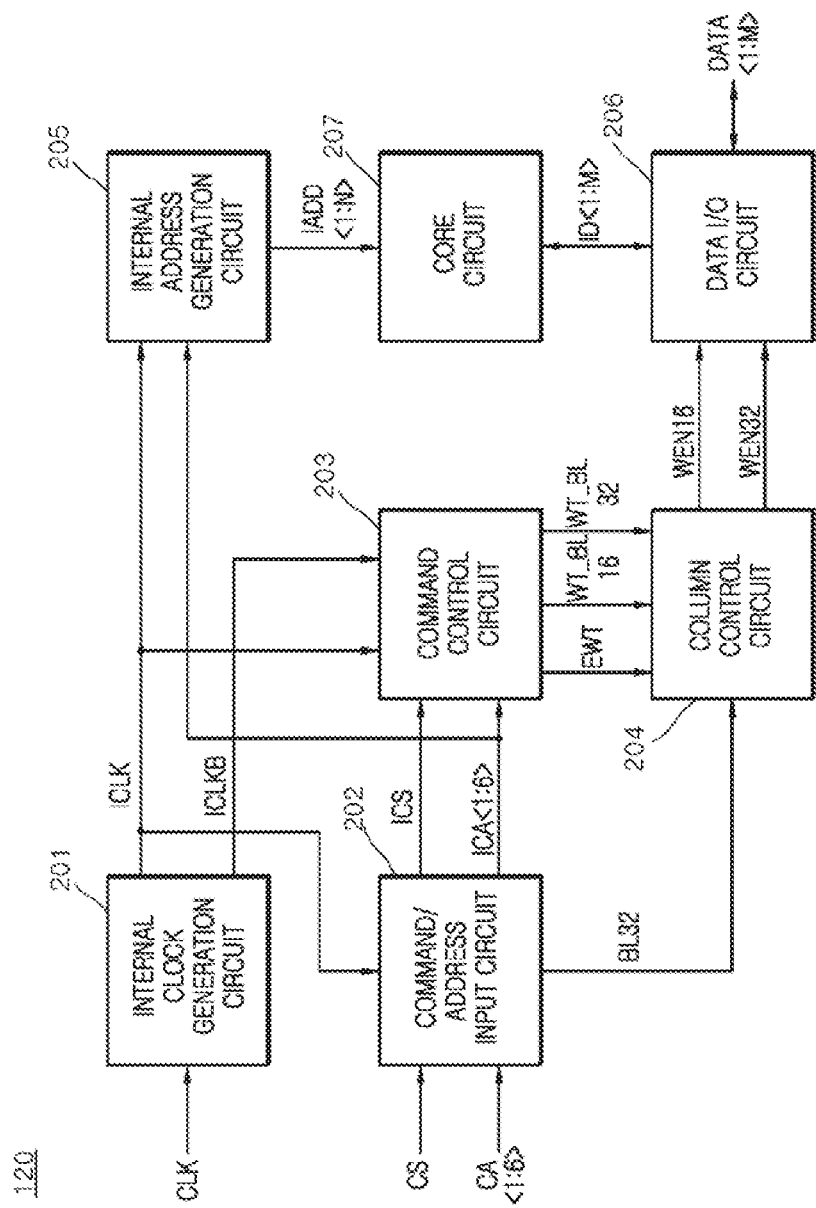
FIG. 2 is a block diagram illustrating a configuration of a semiconductor device included in the electronic device of FIG. 1.

The command control circuit 203 may generate a write command pulse (EWT of FIG. 2) for performing the write operation based on an internal chip selection signal (ICS of FIG. 2) and an internal command/address signal including first to sixth internal command/address signals (ICA<1:6> of FIG. 2). The command control circuit 203 may generate a first write control signal (WT_BL16 of FIG. 2) for performing a first burst operation based on the internal chip selection signal (ICS of FIG. 2) and the first to fifth internal command/address signals ICA<1:5>. The command control circuit 203 may generate a second write control signal (WT_BL32 of FIG. 2) for performing a second burst operation based on the internal chip selection signal (ICS of FIG. 2) and the first to fifth internal command/address signals ICA<1:5>.

The column control circuit 204 may generate a first write enablement signal (WEN16 of FIG. 2), which is enabled during the write operation, based on the write command pulse (EWT of FIG. 2) and the first write control signal (WT_BL16 of FIG. 2). The column control circuit 204 may generate a second write enablement signal (WEN32 of FIG. 2), which is selectively enabled during the write operation, based on the write command pulse (EWT of FIG. 2) and the second write control signal (WT_BL32 of FIG. 2).

The data I/O circuit 206 may perform the first burst operation during an enablement period of the first write enablement signal (WEN16 of FIG. 2) to generate internal data (ID<1:M> of FIG. 2) from the data DATA (i.e., DATA<1:M> of FIG. 2). The data I/O circuit 206 may perform the second burst operation during an enablement period of the second write enablement signal (WEN32 of FIG. 2) to generate the internal data (ID<1:M> of FIG. 2) from the data DATA (i.e., DATA<1:M> of FIG. 2).

The core circuit 207 may store the internal data (ID<1:M> of FIG. 2) based on an internal address (IADD<1:N> of FIG. 2) during the write operation.

FIG. 2 is a block diagram illustrating a configuration of the semiconductor device 120. As illustrated in FIG. 2, the semiconductor device 120 may include an internal clock generation circuit 201, a command/address input circuit 202, the command control circuit 203, the column control circuit 204, an internal address generation circuit 205, the data I/O circuit 206, and the core circuit 207.

The internal clock generation circuit 201 may receive the clock signal CLK to generate an internal clock signal ICLK and an inverted internal clock signal ICLKB. The internal clock generation circuit 201 may generate the internal clock signal ICLK having the same phase as the clock signal CLK. The internal clock generation circuit 201 may generate the inverted internal clock signal ICLKB having a phase opposite to the clock signal CLK. The clock signal CLK, the internal clock signal ICLK, and the inverted internal dock signal ICLKB may have the same frequency and the same toggling frequency. Operations of the internal clock generation circuit 201 for generating the internal dock signal ICLK and the inverted internal clock signal ICLKB from the clock signal CLK will be described with reference to FIG. 3 later.

The command/address input circuit 202 may be synchronized with the internal clock signal ICLK to generate the internal chip selection signal ICS from the chip selection signal CS. The command/address input circuit 202 may buffer the chip selection signal CS in synchronization with the internal clock signal ICLK to generate the internal chip selection signal ICS. The command/address input circuit 202 may be synchronized with the internal clock signal ICLK to generate the first to sixth internal command/address signals ICA<1:6> from the command/address signal CA including first to sixth command/address signals CA<1:6>. The command/address input circuit 202 may buffer the first to sixth command/address signals CA<1:6> in synchronization with the internal clock signal ICLK to generate the first to sixth internal command/address signals ICA<1:6>. The command/address input circuit 202 may be synchronized with the internal clock signal ICLK to generate a burst control signal BL32 from the sixth command/address signal CA<6>. The command/address input circuit 202 may buffer the sixth command/address signal CA<6> in synchronization with the internal clock signal ICLK to generate the burst control signal BL32. The burst control signal BL32 may be a signal for performing the first burst operation or the second burst operation. The first burst operation may be set as an operation for storing 16-bit data at a time during the write operation. The second burst operation may be set as an operation for storing 32-bit data at a time during the write operation. The number of bits included in the data stored at a time during the second burst operation may be "2×N" times the number of bits included in the data stored at a time during the first burst operation (where, "N" is a natural number).

The command control circuit 203 may generate the write command pulse EWT for performing the write operation based on the internal chip selection signal ICS and the first to fifth internal command/address signals ICA<1:5>. The command control circuit 203 may generate the first write control signal WT_BL16 for performing the first burst operation based on the internal chip selection signal ICS and the first to fifth internal command/address signals ICA<1:5>. The command control circuit 203 may generate the second write control signal WT_BL32 for performing the second burst operation based on the internal chip selection signal ICS and the first to fifth internal command/address signals ICA<1:5>.

The command control circuit 203 may generate the write command pulse EWT including a pulse which is created when the internal chip selection signal ICS and the first to fifth internal command/address signals ICA<1:5> have a first logic level combination. The command control circuit 203 may shift the write command pulse EWT by a period for performing the first burst operation to generate the first write control signal WT_BL16 when the internal chip selection signal ICS and the first to fifth internal command/address signals ICA<1:5> have a second logic level combination. The command control circuit 203 may shift the first write control signal WT_BL16 by a period for performing the second burst operation to generate the second write control signal WT_BL32. Various logic level combinations of the internal chip selection signal ICS and the first to fifth internal command/address signals ICA<1:5> for generating the write command pulse EWT, the first write control signal WT_BL16, and the second write control signal WT_BL32 output from the command control circuit 203 will be described with reference to FIG. 4 later.

The column control circuit 204 may generate the first write enablement signal WEN16, which is enabled during the write operation, based on the write command pulse EWT and the first write control signal WT_BL16. The column control circuit 204 may generate the second write enablement signal WEN32, which is selectively enabled during the write operation, based on the burst control signal BL32, the write command pulse EWT, and the second write control signal WT_BL32.

The internal address generation circuit 205 may be synchronized with the internal clock signal ICLK to generate the internal address IADD<1:N> including first to $N^{th}$ internal address signals IADD<1:N> from the first to sixth internal command/address signals ICA<1:6>. The internal address generation circuit 205 may decode the first to sixth internal command/address signals ICA<1:6> in synchronization with the internal clock signal ICLK to generate the first to $N^{th}$ internal address signals IADD<1:N>, one of which is selectively enabled. Logic levels of bits included in the first to sixth internal command/address signals ICA<1:6> for generating the first to $N^{th}$ internal address signals IADD<1:N> output from the internal address generation circuit 205 will be described with reference to FIG. 4 later.

The data I/O circuit 206 may perform the first burst operation during an enablement period of the first write enablement signal WEN16 to generate the internal data ID<1:M> including first to $M^{th}$ internal data ID<1:M> from the data DATA<1:M> including first to $M^{th}$ data DATA<1:M>. The data I/O circuit 206 may perform the second burst operation during an enablement period of the second write enablement signal WEN32 to generate the first to $M^{th}$ internal data ID<1:M> from the first to $M^{th}$ data DATA<1:M>. The data I/O circuit 206 may receive the first to $M^{th}$ data DATA<1:M> twice during the second burst operation to generate the first to $M^{th}$ internal data ID<1:M> twice.

The core circuit 207 may be realized using a general memory circuit including a plurality of memory cells (not shown). The core circuit 207 may store the first to $M^{th}$ internal data ID<1:M> based on the first to $N^{th}$ internal address signals IADD<1:N>. The core circuit 207 may store the first to $M^{th}$ internal data ID<1:M> into memory cells (not shown) which are selected by the first to $N^{th}$ internal address signals IADD<1:N>.

Meanwhile, although FIGS. 1 and 2 illustrate the write operation of the electronic device, the electronic device may also be realized to perform the read operation according to the embodiments.

Figure 3:
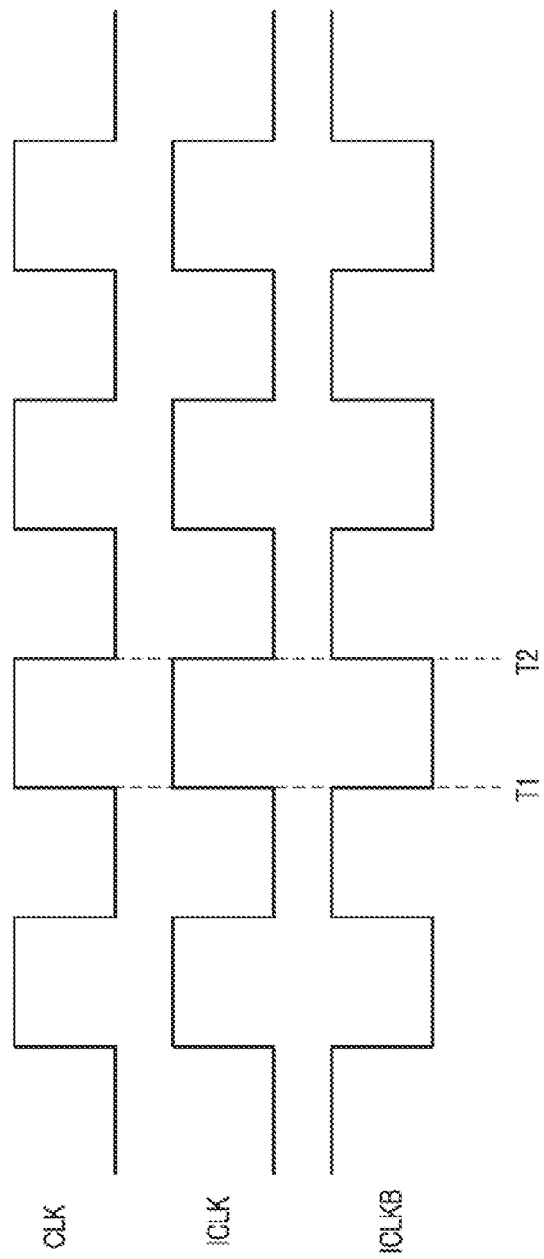
FIG. 3 is a timing diagram illustrating an operation of an internal clock generation circuit included in the semiconductor device of FIG. 2.

An operation of the internal clock generation circuit 201 will be described hereinafter with reference to FIG. 3.

The internal clock generation circuit 201 may generate the internal clock signal ICLK having the same phase as the clock signal CLK. The internal clock generation circuit 201 may generate the inverted internal clock signal ICLKB having a phase opposite to the clock signal CLK.

At a point in time "T1", the internal clock generation circuit 201 may be synchronized with a rising edge of the clock signal CLK to generate the internal clock signal ICLK which is toggled to have a logic "high" level.

At a point in time "T2", the internal clock generation circuit 201 may be synchronized with a falling edge of the clock signal CLK to generate the inverted internal clock signal ICLKB which is toggled to have a logic "high" level.

Logic level combinations of the chip selection signal CS and the command/address signal CA<1:6> for performing the write operation according to an embodiment of the present disclosure will be described hereinafter with reference to FIG. 4.

A first logic level combination (WRITE-1) for performing the write operation may be set as a case that the first command/address signal CA<1>, the second command/address signal CA<2>, the third command/address signal CA<3>, the fourth command/address signal CA<4>, and the fifth command/address signal CA<5>, which are input in synchronization with a rising edge of the clock signal CLK while the chip selection signal CS has a logic "high(H)" level, have a logic "low(L)" level, a logic "low(L)" level, a logic "high(H)" level, a logic "low(L)" level, and a logic "low(L)" level, respectively.

In addition, the sixth command/address signal CA<6>, which is input in synchronization with a rising edge of the clock signal CLK while the chip selection signal CS has a logic "high(H)" level, may be set as a bit for generating the burst control signal BL32. When the sixth command/address signal CA<6> has a logic "low(L)" level, the burst control signal BL32 having a logic "low" level may be generated to perform the first burst operation. When the sixth command/address signal CA<6> has a logic "high(H)" level, the burst control signal BL32 having a logic "high" level may be generated to perform the second burst operation.

While the chip selection signal CS has a logic "low(L)" level, the first command/address signal CA<1> input in synchronization with a rising edge of the clock signal CLK may be set as a first bit BK<1> for selecting a plurality of banks included in the core circuit 207, the second command/address signal CA<2> input in synchronization with a rising edge of the clock signal CLK may be set as a second bit BK<2> for selecting a plurality of banks included in the core circuit 207, and the third command/address signal CA<3> input in synchronization with a rising edge of the clock signal CLK may be set as a third bit BK<3> for selecting a plurality of banks included in the core circuit 207.

While the chip selection signal CS has a logic "low(L)" level, the fourth command/address signal CA<4> input in synchronization with a rising edge of the clock signal CLK may be set as a first bit COL<1> for selecting a plurality of memory cells included in a bank, the fifth command/address signal CA<5> input in synchronization with a rising edge of the clock signal CLK may be set as a second bit COL<2> for selecting a plurality of memory cells included in the bank, and the sixth command/address signal CA<6> input in synchronization with a rising edge of the clock signal CLK may be set as a third bit COL<3> for selecting a plurality of memory cells included in the bank.

A second logic level combination (WRITE-2) for performing the write operation may be set as a case that the first command/address signal CA<1>, the second command/address signal CA<2>, the third command/address signal CA<3>, the fourth command/address signal CA<4>, and the fifth command/address signal CA<5>, which are input in synchronization with a rising edge of the clock signal CLK while the chip selection signal CS has a logic "high(H)" level, have a logic "low(L)" level, a logic "high(H)" level, a logic "low(L)" level, a logic "low(L)" level, and a logic "high(H)" level, respectively. In such a case, the sixth command/address signal CA<6> may be set as a signal having a "DONT CARE STATE" regardless of the write operation. A symbol "X" illustrated in FIG. 4 means a command/address signal which is unused for the write operation.

While the chip selection signal CS has a logic "low(L)" level, the first command/address signal CA<1> input in synchronization with a rising edge of the clock signal CLK may be set as a fourth bit COL<4> for selecting a plurality of memory cells included in a bank, the second command/address signal CA<2> input in synchronization with a rising edge of the clock signal CLK may be set as a fifth bit COL<5> for selecting a plurality of memory cells included in the bank, the third command/address signal CA<3> input in synchronization with a rising edge of the clock signal CLK may be set as a sixth bit COL<6> for selecting a plurality of memory cells included in the bank, the fourth command/address signal CA<4> input in synchronization with a rising edge of the clock signal CLK may be set as a seventh bit COL<7> for selecting a plurality of memory cells included in the bank, the fifth command/address signal CA<5> input in synchronization with a rising edge of the clock signal CLK may be set as an eighth bit COL<8> for selecting a plurality of memory cells included in the bank, and the sixth command/address signal CA<6> input in synchronization with a rising edge of the clock signal CLK may be set as a ninth bit COL<9> for selecting a plurality of memory cells included in the bank.

Logic level combinations of the chip selection signal CS and the command/address signal CA<1:6> for performing the read operation applicable to the present disclosure will be described hereinafter with reference to FIG. 4.

A first logic level combination (READ-1) for performing the read operation may be set as a case that the first command/address signal CA<1>, the second command/address signal CA<2>, the third command/address signal CA<3>, the fourth command/address signal CA<4>, and the fifth command/address signal CA<5>, which are input in synchronization with a rising edge of the clock signal CLK while the chip selection signal CS has a logic "high(H)" level, have a logic "low(L)" level, a logic "high(H)" level, a logic "low(L)" level, a logic "low(L)" level, and a logic "low(L)" level, respectively.

In addition, the sixth command/address signal CA<6>, which is input in synchronization with a rising edge of the clock signal CLK while the chip selection signal CS has a logic "high(H)" level, may be set as a bit for generating the burst control signal BL32, When the sixth command/address signal CA<6> has a logic "low(L)" level, the burst control signal BL32 having a logic "low" level may be generated to perform the first burst operation. When the sixth command/address signal CA<6> has a logic "high(H)" level, the burst control signal BL32 having a logic "high" level may be generated to perform the second burst operation.

While the chip selection signal CS has a logic "low(L)" level, the first command/address signal CA<1> input in synchronization with a rising edge of the clock signal CLK may be set as the first bit BK<1> for selecting a plurality of banks included in the core circuit 207, the second command/address signal CA<2> input in synchronization with a rising edge of the clock signal CLK may be set as the second bit BK<2> for selecting a plurality of banks included in the core circuit 207, and the third command/address signal CA<3> input in synchronization with a rising edge of the clock signal CLK may be set as the third bit BK<3> for selecting a plurality of banks included in the core circuit 207.

While the chip selection signal CS has a logic "low(L)" level, the fourth command/address signal CA<4> input in synchronization with a rising edge of the clock signal CLK may be set as the first bit COL<1> for selecting a plurality of memory cells included in a bank, the fifth command/address signal CA<5> input in synchronization with a rising edge of the clock signal CLK may be set as the second bit COL<2> for selecting a plurality of memory cells included in the bank, and the sixth command/address signal CA<6> input in synchronization with a rising edge of the clock signal CLK may be set as the third bit COL<3> for selecting a plurality of memory cells included in the bank.

A second logic level combination (READ-2) for performing the read operation may be set as a case that the first command/address signal CA<1>, the second command/address signal CA<2>, the third command/address signal CA<3>, the fourth command/address signal CA<4>, and the fifth command/address signal CA<5>, which are input in synchronization with a rising edge of the clock signal CLK while the chip selection signal CS has a logic "high(H)" level, have a logic "low(L)" level, a logic "high(H)" level, a logic "low(L)" level, a logic "low(L)" level, and a logic "high(H)" level, respectively. In such a case, the sixth command/address signal CA<6> may be set as a signal having a "DONT CARE STATE" regardless of the read operation. A symbol "X" illustrated in FIG. 4 means a command/address signal which is unused for the read operation.

While the chip selection signal CS has a logic "low(L)" level, the first command/address signal CA<1> input in synchronization with a rising edge of the clock signal CLK may be set as the fourth bit COL<4> for selecting a plurality of memory cells included in a bank, the second command/address signal CA<2> input in synchronization with a rising edge of the clock signal CLK may be set as the fifth bit COL<5> for selecting a plurality of memory cells included in the bank, the third command/address signal CA<3> input in synchronization with a rising edge of the clock signal CLK may be set as the sixth bit COL<6> for selecting a plurality of memory cells included in the bank, the fourth command/address signal CA<4> input in synchronization with a rising edge of the clock signal CLK may be set as the seventh bit COL<7> for selecting a plurality of memory cells included in the bank, the fifth command/address signal CA<5> input in synchronization with a rising edge of the clock signal CLK may be set as the eighth bit COL<8> for selecting a plurality of memory cells included in the bank, and the sixth command/address signal CA<6> input in synchronization with a rising edge of the clock signal CLK may be set as the ninth bit COL<9> for selecting a plurality of memory cells included in the bank.

Figure 5:
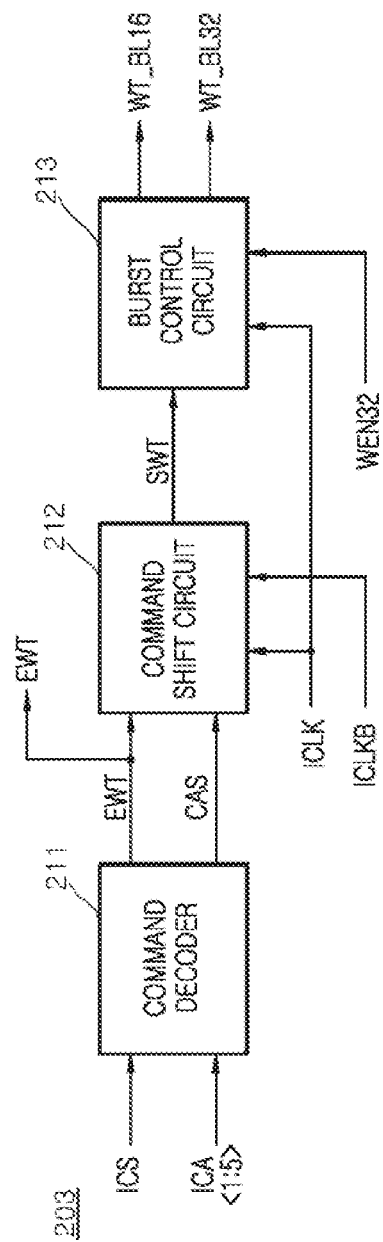
FIG. 5 is a block diagram illustrating a configuration of a command control circuit included in the semiconductor device of FIG. 2.

As illustrated in FIG. 5, the command control circuit 203 may include a command decoder 211, a command shift circuit 212, and a burst control circuit 213.

The command decoder 211 may decode the internal chip selection signal ICS and the first to fifth internal command/address signals ICA<1:5> to generate the write command pulse EWT and an operation control command pulse CAS, one of which is selectively enabled. The command decoder 211 may generate the write command pulse EWT which is created when the internal chip selection signal ICS and the first to fifth internal command/address signals ICA<1:5> have a logic "high(H)" level, a logic "low(L)" level, a logic "low(L)" level, a logic "high(H)" level, a logic "low(L)" level, and a logic "low(L)" level, respectively. The command decoder 211 may generate the operation control command pulse CAS which is created when the internal chip selection signal ICS and the first to fifth internal command/address signals ICA<1:5> have a logic "high(H)" level, a logic "low(L)" level, a logic "high(H)" level, a logic "low(L)" level, a logic "low(L)" level, and a logic "high(H)" level, respectively.

The command shift circuit 212 may be synchronized with the internal clock signal ICLK and the inverted internal clock signal ICLKB to generate a shift command SWT from the operation control command pulse CAS. The command shift circuit 212 may be synchronized with the inverted internal clock signal ICLKB to latch the write command pulse EWT. During a period that the operation control command pulse CAS is generated, the command shift circuit 212 may shift the latched signal of the write command pulse EWT in synchronization with the internal clock signal ICLK to generate a shift command SWT.

The burst control circuit 213 may shift the shift command SWT in synchronization with the internal clock signal ICLK to generate the first write control signal WT_BL16. The burst control circuit 213 may shift the shift command SWT by a period for the first burst operation to generate the first write control signal WT_BL16. The burst control circuit 213 may shift the first write control signal WT_BL16 in synchronization with the internal clock signal ICLK during an enablement period of the second write enablement signal WEN32 to generate the second write control signal WT_BL32. The burst control circuit 213 may shift the first write control signal WT_BL16 by a period for the second burst operation to generate the second write control signal WT_BL32.

Figure 6:
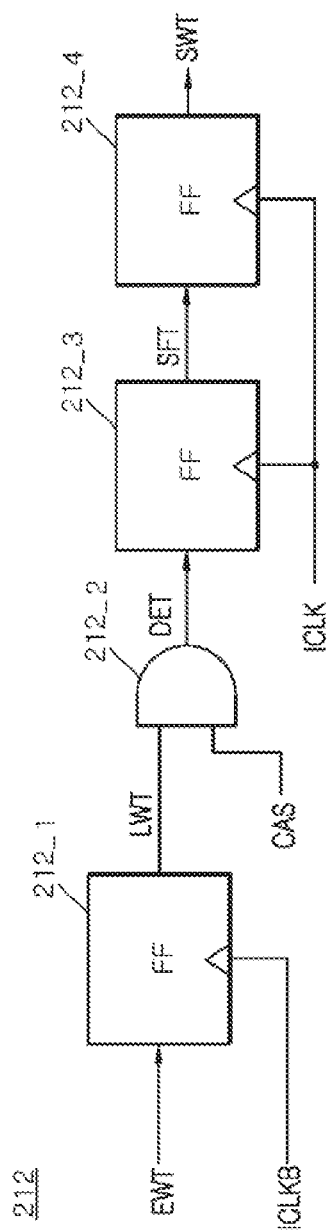
FIG. 6 illustrates a configuration of a command shift circuit included in the command control circuit of FIG. 5.

As illustrated in FIG. 6, the command shift circuit 212 may be realized using flip-flops 212_1, 212_3, and 212_4 and an AND gate 212_2.

The flip-flop 212_1 may be synchronized with a rising edge of the inverted internal clock signal ICLKB to latch the write command pulse EWT. The flip-flop 212_1 may output the latched signal of the write command pulse EWT as a latched command pulse LWT. The flip-flop 212_1 may shift the write command pulse EWT by one cycle of the inverted internal clock signal ICLKB to generate the latched command pulse LWT.

The AND gate 212_2 may buffer the latched command pulse LWT to output the buffered signal of the latched command pulse LWT as a detection signal DET while the operation control command pulse CAS has a logic "high" level. The AND gate 212_2 may perform a logical AND operation of the operation control command pulse CAS and the latched command pulse LWT to generate the detection signal DET.

The flip-flop 212_3 may be synchronized with a rising edge of the internal clock signal ICLK to latch the detection signal DET. The flip-flop 212_3 may output the latched signal of the detection signal DET as a shift signal SFT. The flip-flop 212_3 may shift the detection signal DET by one cycle of the internal clock signal ICLK to generate the shift signal SFT.

The flip-flop 212_4 may be synchronized with a rising edge of the internal clock signal ICLK to latch the shift signal SFT. The flip-flop 212_4 may output the latched signal of the shift signal SFT as the shift command SWT. The flip-flop 212_4 may shift the shift signal SFT by one cycle of the internal clock signal ICLK to generate the shift command SWT.

Figure 7:
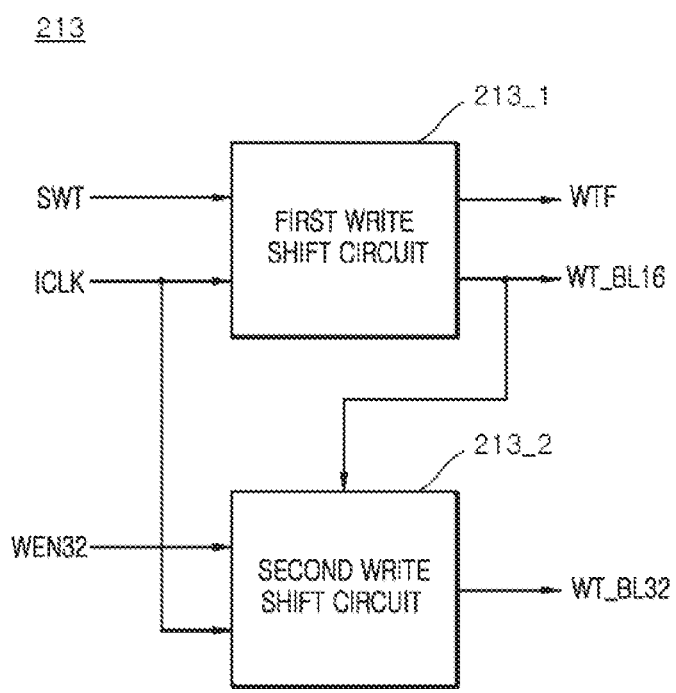
FIG. 7 is a block diagram illustrating a configuration of a burst control circuit included in the command control circuit of FIG. 5.

As illustrated in FIG. 7, the burst control circuit 213 may include a first write shift circuit 213_1 and a second write shift circuit 213_2.

The first write shift circuit 213_1 may shift the shift command SWT by a period for performing the first burst operation in synchronization with the internal clock signal ICLK to generate a write flag signal WTF and the first write control signal WT_BL16 which are sequentially enabled.

While the second write enablement signal WEN32 is enabled, the second write shift circuit 213_2 may shift the first write control signal WT_BL16 by a period for performing the second burst operation in synchronization with the internal clock signal ICLK to generate the second write control signal WT_BL32.

Figure 8:
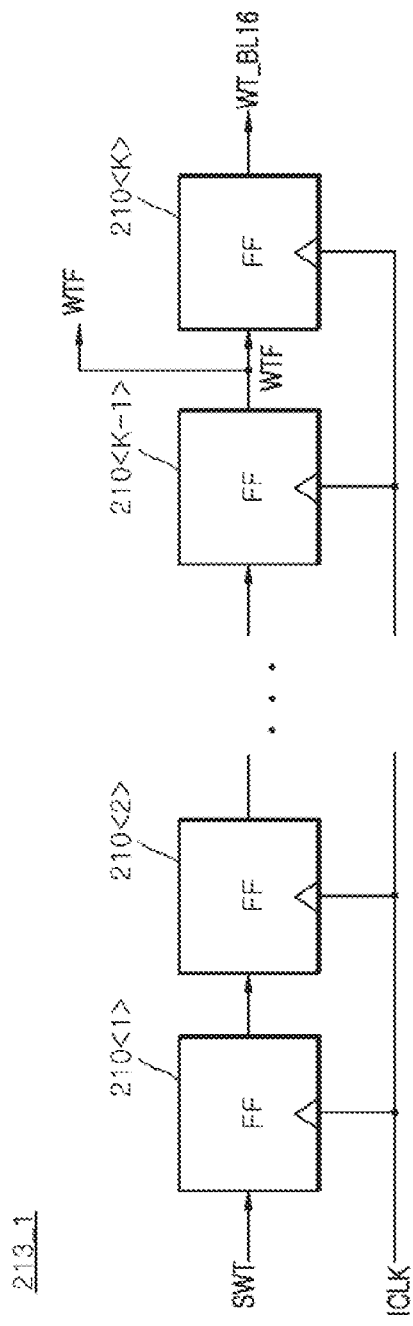
FIG. 8 illustrates a configuration of a first write shift circuit included in the burst control circuit of FIG. 7.

As illustrated in FIG. 8, the first write shift circuit 213_1 may be realized using flip-flops 210<1:K>.

The flip-flop 210<1> may be synchronized with a rising edge of the internal clock signal ICLK to latch the shift command SWT. The flip-flop 210<1> may output the latched signal of the shift command SWT. The flip-flop 210<1> may shift the shift command SWT by one cycle of the internal clock signal ICLK to output the shifted signal of the shift command SWT.

Each of the flip-flops 210<2:(K−2)> may perform the same operation as the flip-flop 210<1>. Thus, descriptions for operations of the flip-flops 210<2:(K−2)> will be omitted hereinafter.

The flip-flop 210<K−1> may be synchronized with a rising edge of the internal clock signal ICLK to latch an output signal of the flip-flop 210<K−2>. The flip-flop 210<K−1> may output the latched signal of the output signal of the flip-flop 210<K−2> as the write flag signal WTF. The flip-flop 210<K−1> may shift the output signal of the flip-flop 210<K−2> by one cycle of the internal clock signal ICLK to output the shifted signal of the output signal of the flip-flop 210<K−2> as the write flag signal WTF.

The flip-flop 210<K> may be synchronized with a rising edge of the internal dock signal ICLK to latch the write flag signal WTF. The flip-flop 210<K> may output the lathed signal of the write flag signal WTF as the first write control signal WT_BL16. The flip-flop 210<K> may shift the write flag signal WTF by one cycle of the internal clock signal ICLK to output the shifted signal of the write flag signal WTF as the first write control signal WT_BL16.

The number "K" of the flip-flops 210<1:K> included in the first write shift circuit 213_1 may be set to be different according to a shift period for the first burst operation.

Figure 9:
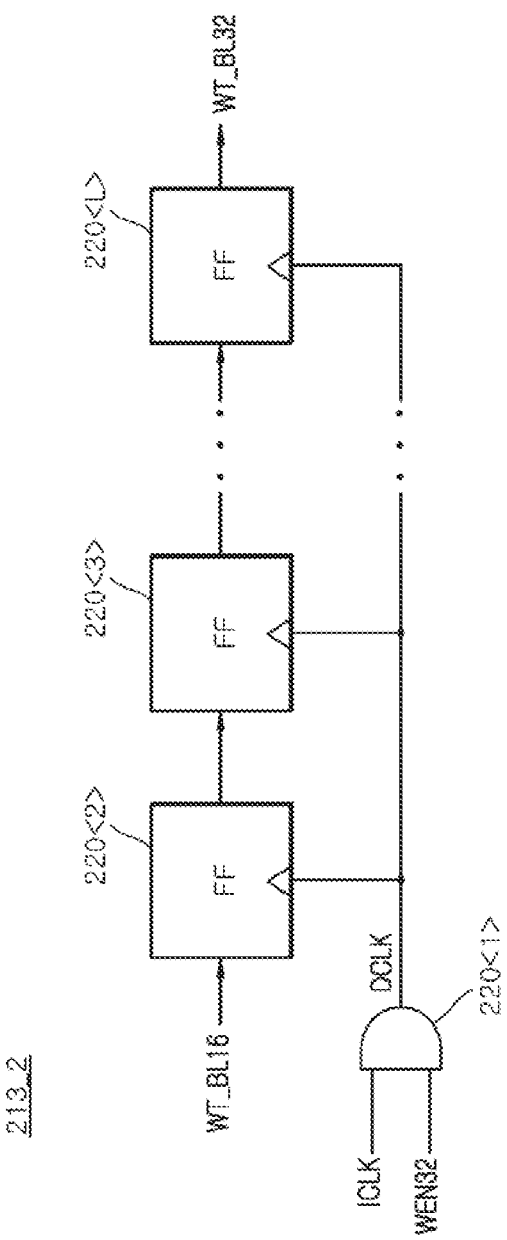
FIG. 9 illustrates a configuration of a second write shift circuit included in the burst control circuit of FIG. 7.

As illustrated in FIG. 9, the second write shift circuit 213_2 may be realized using an AND gate 220<1> and flip-flops 220<2:L>.

The AND gate 220<1> may buffer the internal clock signal ICLK to generate a delayed clock signal DCLK while the second write enablement signal WEN32 is enabled to have a logic "high" level. The AND gate 220<1> may perform a logical AND operation of the second write enablement signal WEN32 and the internal clock signal ICLK to generate the delayed clock signal DCLK.

The flip-flop 220<2> may be synchronized with a rising edge of the delayed clock signal DCLK to latch the first write control signal WT_BL16. The flip-flop 220<2> may output the latched signal of the first write control signal WT_BL16. The flip-flop 220<2> may shift the first write control signal WT_BL16 by one cycle of the delayed clock signal DCLK to output the shifted signal of the first write control signal WT_BL16.

Each of the flip-flops 220<2:(L−1)> may perform the same operation as the flip-flop 220<2>. Thus, descriptions for operations of the flip-flops 220<2:(L−1)> will be omitted hereinafter.

The flip-flop 220<L> may be synchronized with a rising edge of the delayed clock signal DCLK to latch an output signal of the flip-flop 220<L−1>. The flip-flop 220<L> may output the latched signal of the output signal of the flip-flop 220<L−1> as the second write control signal WT_BL32. The flip-flop 220<L> may shift the output signal of the flip-flop 220<L−1> by one cycle of the delayed clock signal DCLK to output the shifted signal of the output signal of the flip-flop 220<L−1> as the second write control signal WT_BL32.

The number "L−1" of the flip-flops 220<2:L> included in the second write shift circuit 213_2 may be set to be different according to a shift period for the second burst operation.

Figure 10:
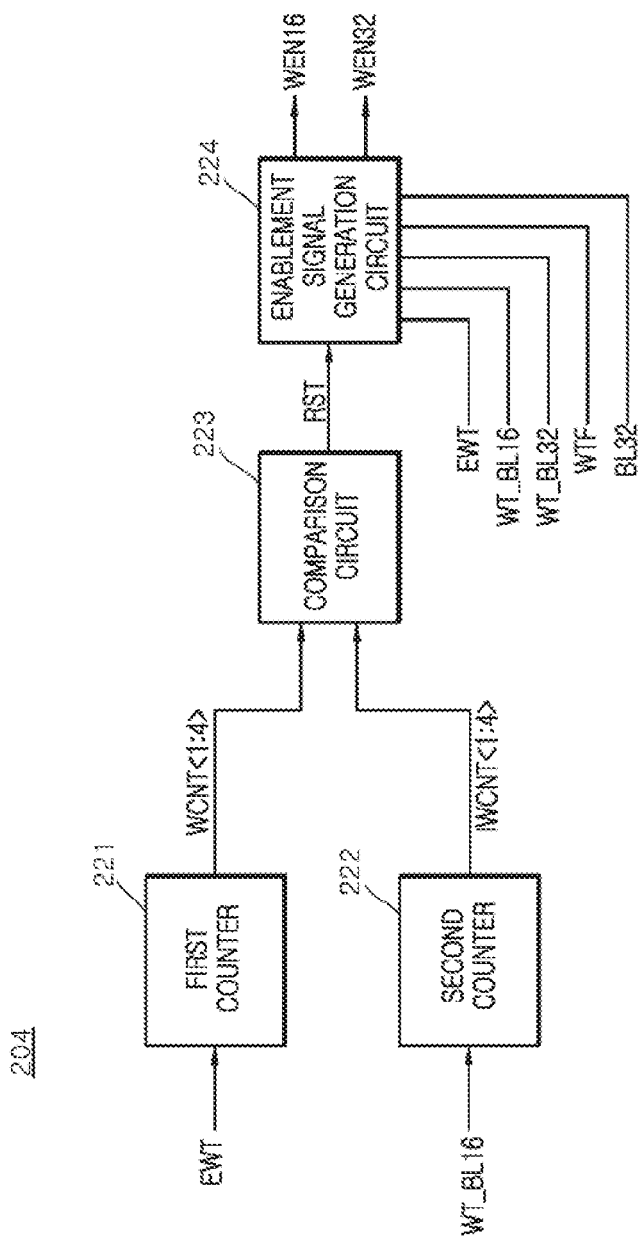
FIG. 10 is a block diagram illustrating a configuration of a column control circuit included in the semiconductor device of FIG. 2.

As illustrated in FIG. 10, the column control circuit 204 may include a first counter 221, a second counter 222, a comparison circuit 223, and an enablement signal generation circuit 224.

The first counter 221 may generate first to fourth write count signals WCNT<1:4> which are counted by the same number of times as the write command pulse EWT is input to the first counter 221. The first counter 221 may generate the first to fourth write count signals WCNT<1:4> which are sequentially enabled by the same number of times as the write command pulse EWT is input to the first counter 221. For example, the first counter 221 may generate the first write count signal WCNT<1> having a logic "high" level when the write command pulse EWT is input to the first counter 221 once, and the first counter 221 may generate the second write count signal WCNT<2> having a logic "high" level when the write command pulse EWT is input to the first counter 221 twice.

The second counter 222 may generate first to fourth internal write count signals IWCNT<1:4> which are counted by the same number of times as the first write control signal WT_BL16 is input to the second counter 222. The second counter 222 may generate the first to fourth internal write count signals IWCNT<1:4> which are sequentially enabled by the same number of times as the first write control signal WT_BL16 is input to the second counter 222. For example, the second counter 222 may generate the first internal write count signal IWCNT<1> having a logic "high" level when the first write control signal WT_BL16 is input to the second counter 222 once, and the second counter 222 may generate the second internal write count signal IWCNT<2> having a logic "high" level when the first write control signal WT_BL16 is input to the second counter 222 twice.

The comparison circuit 223 may compare the first to fourth write count signals WCNT<1:4> with the first to fourth internal write count signals IWCNT<1:4> to generate a reset signal RST. The comparison circuit 223 may generate the reset signal RST which is enabled when the number of times that the first to fourth write count signals WCNT<1:4> are counted is equal to the number of times that the first to fourth internal write count signals IWCNT<1:4> are counted.

The enablement signal generation circuit 224 may generate the first write enablement signal WEN16 which is enabled by the write command pulse EWT, the first write control signal WT_BL16, and the reset signal RST during the first burst operation and the second burst operation. The enablement signal generation circuit 224 may generate the first write enablement signal WEN16 which is enabled by the write command pulse EWT and which is disabled by the first write control signal WT_BL16 and the reset signal RST.

The enablement signal generation circuit 224 may generate the second write enablement signal WEN32 which is enabled by the write flag signal WTF, the burst control signal 131_32, and the second write control signal WT_BL32 during the second burst operation. The enablement signal generation circuit 224 may generate the second write enablement signal WEN32 which is enabled by the write flag signal WTF and the burst control signal BL32 and which is disabled by the second write control signal WT_BL32.

Figure 11:
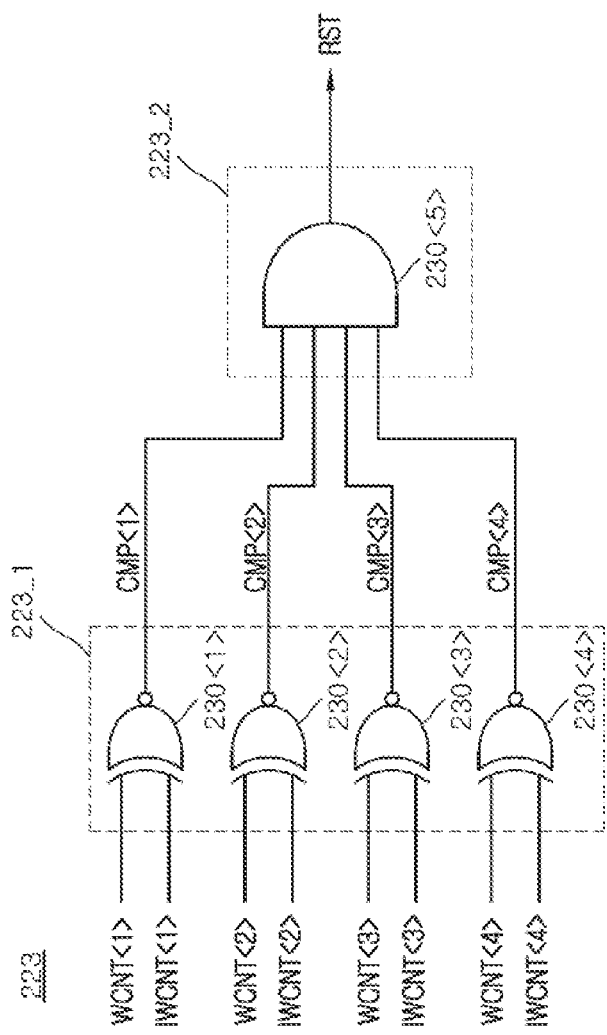
FIG. 11 is a circuit diagram illustrating a configuration of a comparison circuit included in the column control circuit of FIG. 10.

As illustrated in FIG. 11, the comparison circuit 223 may include a comparison signal generation circuit 223_1 and a logic circuit 223_2.

The comparison signal generation circuit 223_1 may be realized using exclusive NOR gates 230<1:4>.

The exclusive NOR gate 230<1> may compare the first write count signal WCNT<1> with the first internal write count signal IWCNT<1> to generate a first comparison signal CMP<1>. The exclusive NOR gate 230<1> may generate the first comparison signal CMP<1> which is enabled to have a logic "high" level when the first write count signal WCNT<1> and the first internal write count signal IWCNT<1> have the same logic level. The exclusive NOR gate 230<1> may generate the first comparison signal CMP<1> which is disabled to have a logic "low" level when the first write count signal WCNT<1> and the first internal write count signal IWCNT<1> have different logic levels.

The exclusive NOR gate 230<2> may compare the second write count signal WCNT<2> with the second internal write count signal IWCNT<2> to generate a second comparison signal CMP<2>. The exclusive NOR gate 230<2> may generate the second comparison signal CMP<2> which is enabled to have a logic "high" level when the second write count signal WCNT<2> and the second internal write count signal IWCNT<2> have the same logic level. The exclusive NOR gate 230<2> may generate the second comparison signal CMP<2> which is disabled to have a logic "low" level when the second write count signal WCNT<2> and the second internal write count signal IWCNT<2> have different logic levels.

The exclusive NOR gate 230<3> may compare the third write count signal WCNT<3> with the third internal write count signal IWCNT<3> to generate a third comparison signal CMP<3>. The exclusive NOR gate 230<3> may generate the third comparison signal CMP<3> which is enabled to have a logic "high" level when the third write count signal WCNT<3> and the third internal write count signal IWCNT<3> have the same logic level. The exclusive NOR gate 230<3> may generate the third comparison signal CMP<3> which is disabled to have a logic "low" level when the third write count signal WCNT<3> and the third internal write count signal IWCNT<3> have different logic levels.

The exclusive NOR gate 230<4> may compare the fourth write count signal WCNT<4> with the fourth internal write count signal IWCNT<4> to generate a fourth comparison signal CMP<4>. The exclusive NOR gate 230<4> may generate the fourth comparison signal CMP<4> which is enabled to have a logic "high" level when the fourth write count signal WCNT<4> and the fourth internal write count signal IWCNT<4> have the same logic level. The exclusive NOR gate 230<4> may generate the fourth comparison signal CMP<4> which is disabled to have a logic "low" level when the fourth write count signal WCNT<4> and the fourth internal write count signal IWCNT<4> have different logic levels.

The logic circuit 223_2 may be realized using an AND gate 230<5>. The logic circuit 223_2 may perform a logical AND operation of the first to fourth comparison signals CMP<1:4> to generate the reset signal RST. The logic circuit 223_2 may generate the reset signal RST which is enabled to have a logic "high" level when all of the first to fourth comparison signals CMP<1:4> have a logic "high" level. The logic circuit 223_2 may generate the reset signal RST which is disabled to have a logic "low" level when at least one of the first to fourth comparison signals CMP<1:4> has a logic "low" level.

Figure 12:
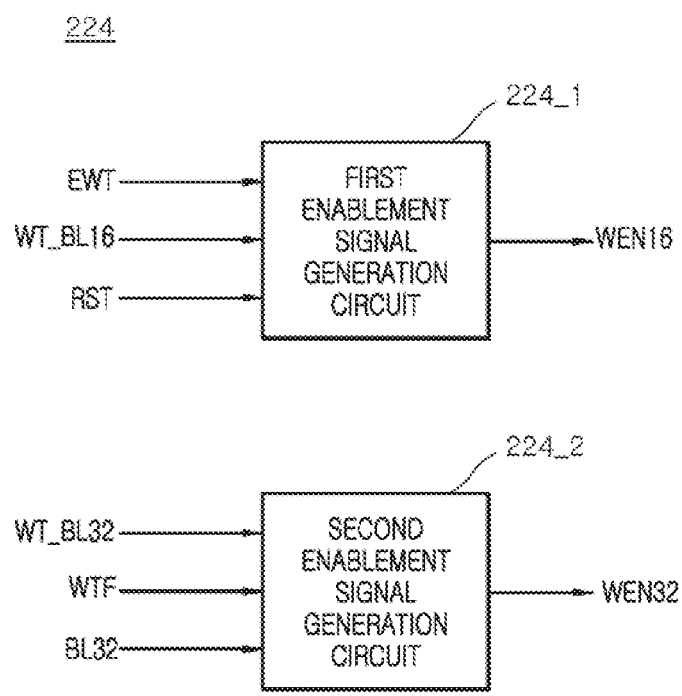
FIG. 12 is a block diagram illustrating a configuration of an enablement signal generation circuit included in the column control circuit of FIG. 10.

As illustrated in FIG. 12, the enablement signal generation circuit 224 may include a first enablement signal generation circuit 224_1 and a second enablement signal generation circuit 224_2.

The first enablement signal generation circuit 224_1 may generate the first write enablement signal WEN16 which is enabled at a point in time when the write command pulse EWT is input to the first enablement signal generation circuit 224_1 and which is disabled at a point in time when the first write control signal WT_BL16 and the reset signal RST are enabled. The first enablement signal generation circuit 224_1 may generate the first write enablement signal WEN16 which is enabled to have a logic "high" level when the write command pulse EWT having a logic "high" level is input. The first enablement signal generation circuit 224_1 may generate the first write enablement signal WEN16 which is disabled to have a logic "low" level when the first write control signal WT_BL16 having a logic "high" level is input and the reset signal RST having a logic "high" level is input.

The second enablement signal generation circuit 224_2 may generate the second write enablement signal WEN32 which is enabled while the write flag signal WTF and the burst control signal BL32 are enabled and which is disabled at a point in time when the second write control signal WT_BL32 is input to the second enablement signal generation circuit 224_2. The second enablement signal generation circuit 224_2 may generate the second write enablement signal WEN32 which is enabled to have a logic "high" level when the write flag signal WTF and the burst control signal BL32 have a logic "high" level. The second enablement signal generation circuit 224_2 may generate the second write enablement signal WEN32 which is disabled to have a logic "low" level when the second write control signal WT_BL32 has a logic "high" level.

Figure 13:
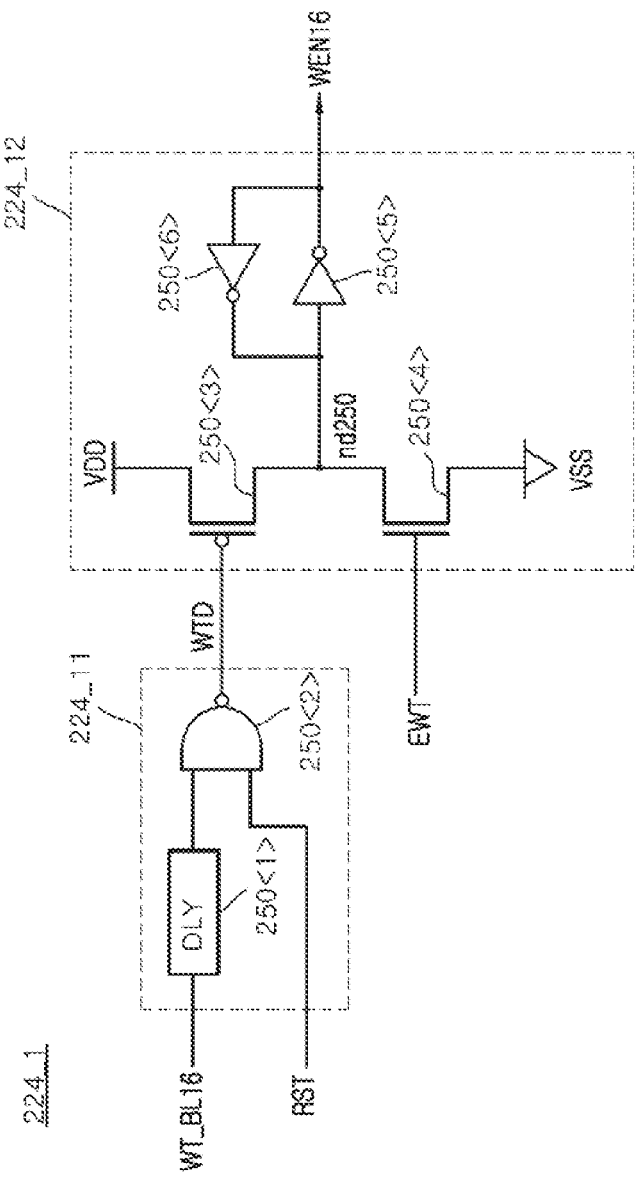
FIG. 13 is a circuit diagram illustrating a configuration of a first enablement signal generation circuit included in the enablement signal generation circuit of FIG. 12.

As illustrated in FIG. 13, the first enablement signal generation circuit 224_1 may include a write delay signal generation circuit 224_11 and a first drive circuit 224_12.

The write delay signal generation circuit 224_11 may be realized using a delay circuit 250<1> and a NAND gate 250<2>.

The delay circuit 250<1> may delay the first write control signal WT_BL16 to output the delayed signal of the first write control signal WT_BL16.

The NAND gate 250<2> may perform a logical NAND operation of an output signal of the delay circuit 250<1> and the reset signal RST to generate a write delay signal WTD.

The write delay signal generation circuit 224_11 may generate the write delay signal WTD which is enabled to have a logic "low" level after an internal delay time elapses from a point in time when the first write control signal WT_BL16 has a logic "high" level while the reset signal RST is enabled to have a logic "high" level. The internal delay time means a delay time of the delay circuit 250<1>.

The first drive circuit 224_12 may be realized using a PMOS transistor 250<3>, an NMOS transistor 250<4>, and inverters 250<5> and 250<6>.

The PMOS transistor 250<3> may be coupled between a supply terminal of a power source voltage VDD and a node nd250 to pull up a level of the node nd250 in response to the write delay signal WTD.

The NMOS transistor 250<4> may be coupled between the node nd250 and a supply terminal of a ground voltage VSS to pull down a level of the node nd250 in response to the write command pulse EWT.

The inverters 250<5:6> may latch a signal of the node nd250 and may inversely buffer the latched signal of the signal of the node nd250 to generate the first write enablement signal WEN16.

The first drive circuit 224_12 may generate the first write enablement signal WEN16 which is enabled to have a logic "high" level at a point in time when the write command pulse EWT having a logic "high" level is input to the first drive circuit 224_12 and which is disabled to have a logic "low" level at a point in time when the write delay signal WTD having a logic "low" level is input to the first drive circuit 224_12.

Figure 14:
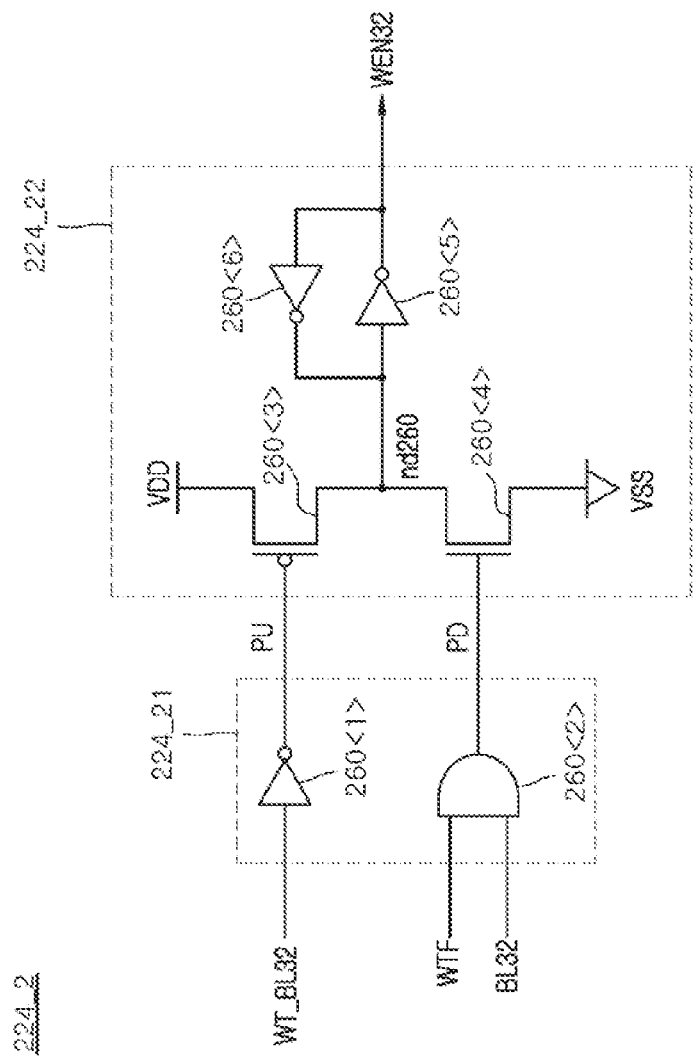
FIG. 14 is a circuit diagram illustrating a configuration of a second enablement signal generation circuit included in the enablement signal generation circuit of FIG. 12.

As illustrated in FIG. 14, the second enablement signal generation circuit 224_2 may include a pull-up/pull-down signal generation circuit 224_21 and a second drive circuit 224_22.

The pull-up/pull-down signal generation circuit 224_21 may be realized using an inverter 260<1> and an AND gate 260<2>.

The inverter 260<1> may inversely buffer the second write control signal WT_BL32 to generate a pull-up signal PU.

The AND gate 260<2> may perform a logical AND operation of the write flag signal WTF and the burst control signal 13132 to generate a pull-down signal PD.

The pull-up/pull-down signal generation circuit 224_21 may generate the pull-up signal PU which is enabled to have a logic "low" level at a point in time when the second write control signal WT_BL32 having a logic "high" level is input to the pull-up/pull-down signal generation circuit 224_21. The pull-up/pull-down signal generation circuit 224_21 may generate the pull-down signal PD which is enabled to have a logic "high" level when the write flag signal WTF having a logic "high" level and the burst control signal BL32 having a logic "high" level are input to the pull-up/pull-down signal generation circuit 224_21.

The second drive circuit 224_22 may be realized using a PMOS transistor 260<3>, an NMOS transistor 260<4>, and inverters 260<5> and 260<6>.

The PMOS transistor 260<3> may be coupled between the supply terminal of the power source voltage VDD and a node nd260 to pull up a level of the node nd260 in response to the pull-up signal PU.

The NMOS transistor 260<4> may be coupled between the node nd260 and the supply terminal of the ground voltage VSS to pull down a level of the node nd260 in response to the pull-down signal PD.

The inverters 260<5:6> may latch a signal of the node nd260 and may inversely buffer the latched signal of the signal of the node nd260 to generate the second write enablement signal WEN32.

The second drive circuit 224_22 may generate the second write enablement signal WEN32 which is enabled to have a logic "high" level at a point in time when the pull-down signal PD having a logic "high" level is input to the second drive circuit 224_22 and which is disabled to have a logic "low" level at a point in time when the pull-up signal PU having a logic "low" level is input to the second drive circuit 224_22.

Figure 15:
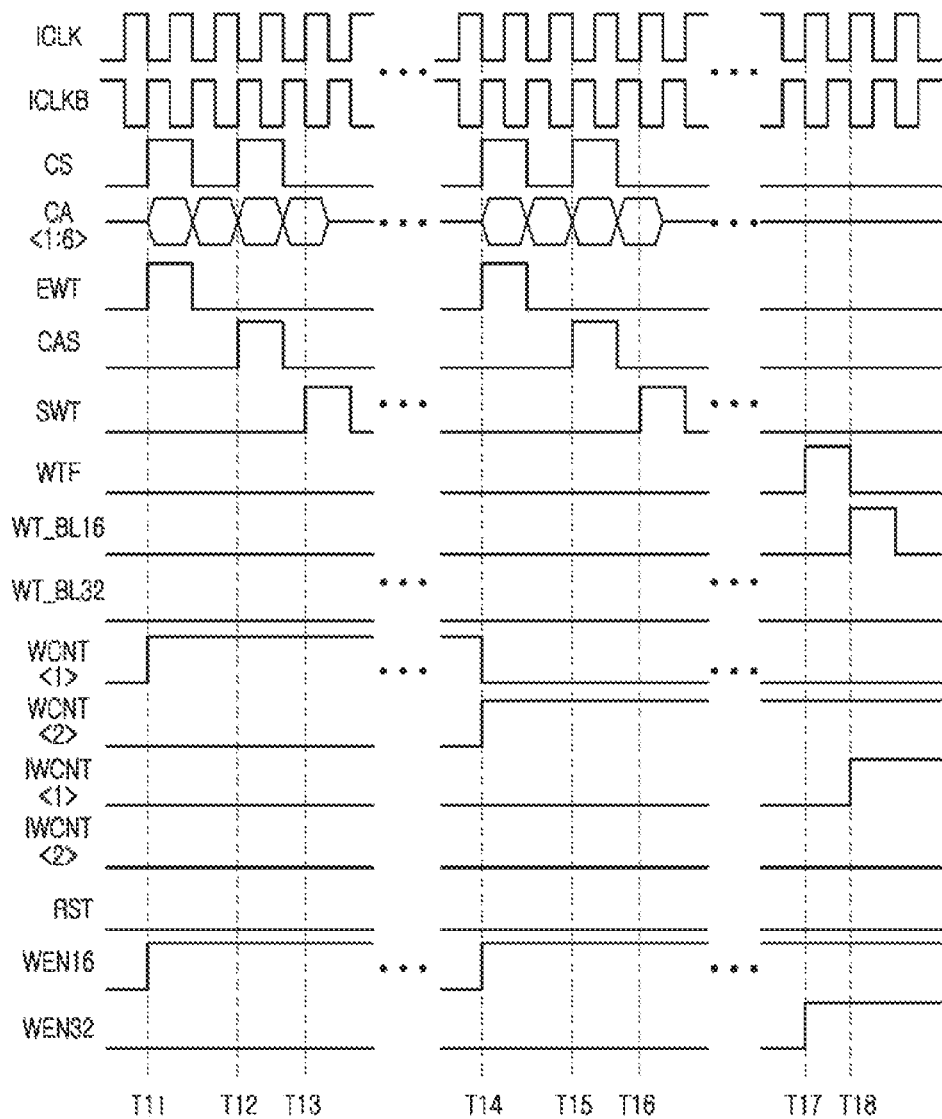
FIGS. 15 and 16 are timing diagrams illustrating a burst operation of an electronic device according to an embodiment of the present disclosure.
Figure 16:
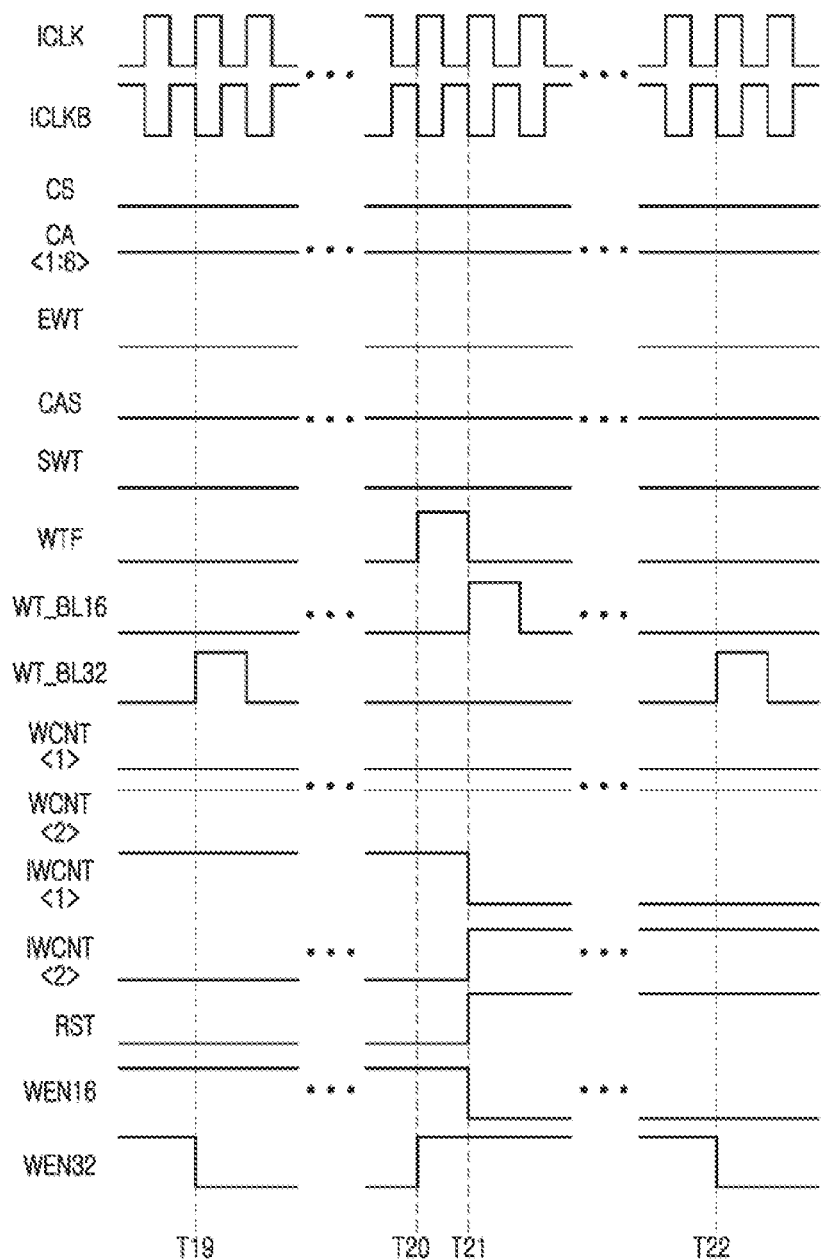

An operation for generating the first write enablement signal WEN16 and the second write enablement signal WEN32 for performing the second burst operation during two write operations successively executed in the electronic device 100 will be described hereinafter with reference to FIGS. 15 and 16.

At a point in time "T11", the controller 110 may output the clock signal CLK as well as the chip selection signal CS (having a logic "high" level) and the first to fifth command/address signals CA<1:5> having a first logic level combination for performing the write operation. In addition, the controller 110 may output the sixth command/address signal CA<6> having a logic "high" level to perform the second burst operation.

The internal clock generation circuit 201 may receive the clock signal CLK to generate the internal clock signal ICLK and the inverted internal clock signal ICLKB.

The command/address input circuit 202 may buffer the chip selection signal CS in synchronization with the internal clock signal ICLK to generate the internal chip selection signal ICS. The command/address input circuit 202 may buffer the first to sixth command/address signals CA<1:6> in synchronization with the internal clock signal ICLK to generate the first to sixth internal command/address signals ICA<1:6>.

The command decoder 211 may generate the write command pulse EWT having a logic "high" level for performing the write operation based on the internal chip selection signal ICS (having a logic "high" level) and the first to fifth internal command/address signals ICA<1:5> having the first logic level combination.

The first counter 221 may receive the write command pulse EWT having a logic "high" level to generate the first write count signal WCNT<1> having a logic "high" level.

The first enablement signal generation circuit 224_1 may generate the first write enablement signal WEN16 which is enabled to have a logic "high" level based on the write command pulse EWT having a logic "high" level.

At a point in time "T12", the controller 110 may output the clock signal CLK as well as the chip selection signal CS and the first to fifth command/address signals CA<1:5> having a second logic level combination for performing the write operation.

The command/address input circuit 202 may buffer the chip selection signal CS in synchronization with the internal clock signal ICLK to generate the internal chip selection signal ICS. The command/address input circuit 202 may buffer the first to fifth command/address signals CA<1:5> in synchronization with the internal clock signal ICLK to generate the first to fifth internal command/address signals ICA<1:5>.

The command decoder 211 may generate the operation control command pulse CAS having a logic "high" level for performing the write operation based on the internal chip selection signal ICS (having a logic "high" level) and the first to fifth internal command/address signals ICA<1:5> having the second logic level combination.

At a point in time "T13", the command shift circuit 212 may be synchronized with the internal clock signal ICLK to generate the shift command SWT having a logic "high" level from the write command pulse EWT and the operation control command pulse CAS.

At a point in time "T14", the controller 110 may output the clock signal CLK as well as the chip selection signal CS (having a logic "high" level) and the first to fifth command/address signals CA<1:5> having a first logic level combination for performing the write operation. In addition, the controller 110 may output the sixth command/address signal CA<6> having a logic "high" level to perform the second burst operation.

The command/address input circuit 202 may buffer the chip selection signal CS in synchronization with the internal clock signal ICLK to generate the internal chip selection signal ICS. The command/address input circuit 202 may buffer the first to sixth command/address signals CA<1:6> in synchronization with the internal clock signal ICLK to generate the first to sixth internal command/address signals ICA<1:6>.

The command decoder 211 may generate the write command pulse EWT having a logic "high" level for performing the write operation based on the internal chip selection signal ICS (having a logic "high" level) and the first to fifth internal command/address signals ICA<1:5> having the first logic level combination.

The first counter 221 may receive the write command pulse EWT having a logic "high" level to generate the first write count signal WCNT<1> having a logic "low" level and the second write count signal WCNT<2> having a logic "high" level.

The first enablement signal generation circuit 224_1 may generate the first write enablement signal WEN16 which is enabled to have a logic "high" level based on the write command pulse EWT having a logic "high" level.

At a point in time "T15", the controller 110 may output the clock signal CLK as well as the chip selection signal CS (having a logic "high" level) and the first to fifth command/address signals CA<1:5> having a second logic level combination for performing the write operation.

The command/address input circuit 202 may buffer the chip selection signal CS in synchronization with the internal clock signal ICLK to generate the internal chip selection signal ICS. The command/address input circuit 202 may buffer the first to fifth command/address signals CA<1:5> in synchronization with the internal clock signal ICLK to generate the first to fifth internal command/address signals ICA<1:5>.

command decoder 211 may generate the operation control command pulse CAS having a logic "high" level for performing the write operation based on the internal chip selection signal ICS (having a logic "high" level) and the first to fifth internal command/address signals ICA<1:5> having the second logic level combination.

At a point in time "T16", the command shift circuit 212 may be synchronized with the internal clock signal ICLK to generate the shift command SWT having a logic "high" level from the write command pulse EWT and the operation control command pulse CAS.

At a point in time "T17", the first write shift circuit 213_1 may shift the shift command SWT generated at the point in time "T13" by a period for performing the first burst operation in synchronization with the internal clock signal ICLK to generate the write flag signal WTF having a logic "high" level.

The second enablement signal generation circuit 224_2 may generate the second write enablement signal WEN32 which is enabled to have a logic "high" level based on the write flag signal WTF having a logic "high" level and the burst control signal BL32 having a logic "high" level.

At a point in time "T18", the first write shift circuit 213_1 may shift the shift command SWT in synchronization with the internal clock signal ICLK to generate the first write control signal WT_BL16 having a logic "high" level.

The second counter 222 may receive the first write control signal WT_BL16 having a logic "high" level to generate the first internal write count signal IWCNT<1> having a logic "high" level.

At a point in time "T19", the second write shift circuit 213_2 may shift the first write control signal WT_BL16 generated at the point in time "T18" by a period for performing the second burst operation in synchronization with the second write enablement signal WEN32 having a logic "high" level and the internal clock signal ICLK to generate the second write control signal WT_BL32 having a logic "high" level.

The second enablement signal generation circuit 224_2 may generate the second write enablement signal WEN32 which is disabled to have a logic "low" level based on the second write control signal WT_BL32 having a logic "high" level.

At a point in time "T20", the first write shift circuit 213_1 may shift the shift command SWT generated at the point in time "T16" by a period for performing the first burst operation in synchronization with the internal clock signal ICLK to generate the write flag signal WTF having a logic "high" level.

The second enablement signal generation circuit 224_2 may generate the second write enablement signal WEN32 which is enabled to have a logic "high" level based on the write flag signal WTF having a logic "high" level and the burst control signal BL32 having a logic "high" level.

At a point in time "T21", the first write shift circuit 213_1 may shift the write flag signal WTF in synchronization with the internal dock signal ICLK to generate the first write control signal WT_BL16 having a logic "high" level.

The second counter 222 may receive the first write control signal WT_BL16 having a logic "high" level to generate the first internal write count signal IWCNT<1> having a logic "low" level and the second internal write count signal IWCNT<2> having a logic "high" level.

The comparison circuit 223 may generate the reset signal RST having a logic "high" level because the number of times that the first to fourth write count signals WCNT<1:4> are counted is equal to the number of times that the first to fourth internal write count signals IWCNT<1:4> are counted.

The first enablement signal generation circuit 224_1 may generate the first write enablement signal WEN16 which is disabled to have a logic "low" level based on the first write control signal WT_BL16 having a logic "high" level and the reset signal RST having a logic "high" level.

At a point in time "T22", the second write shift circuit 213_2 may shift the first write control signal WT_BL16 generated at the point in time "T21" by a period for performing the second burst operation in synchronization with the second write enablement signal WEN32 having a logic "high" level and the internal clock signal ICLK to generate the second write control signal WT_BL32 having a logic "high" level.

The second enablement signal generation circuit 224_2 may generate the second write enablement signal WEN32 which is disabled to have a logic "low" level based on the second write control signal WT_BL32 having a logic "high" level.

As described above, an electronic device according to an embodiment may set enablement periods of signals for performing a first burst operation and a second burst operation based on a chip selection signal and a command/address signal which are successively input in synchronization with a clock signal. Accordingly, it may be possible to reduce power consumption of the electronic device.

Figure 17:
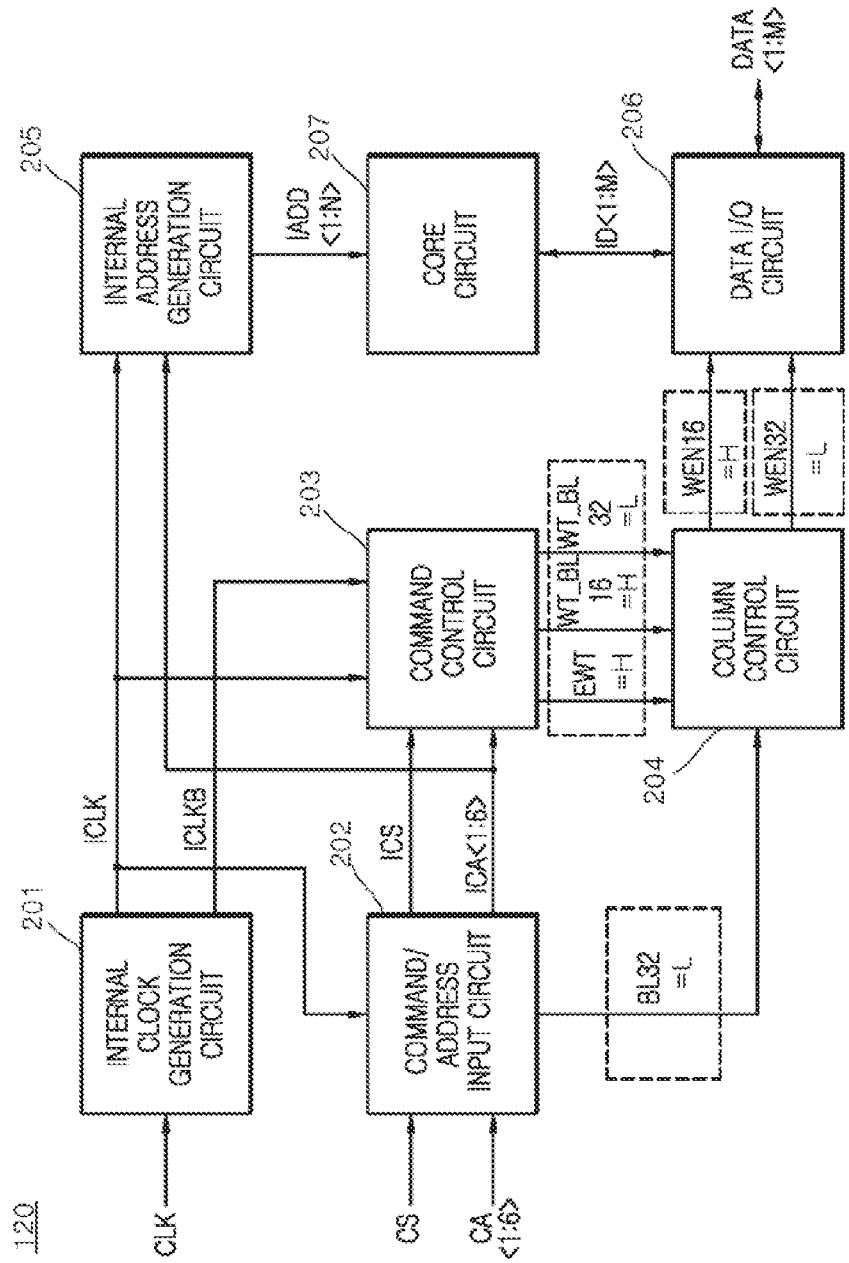
FIGS. 17 and 18 are block diagrams illustrating a first burst operation and a second burst operation of an electronic device according to an embodiment of the present disclosure, respectively.

An operation for performing the first burst operation during the write operation of the electronic device 100 according to an embodiment of the present disclosure will be described hereinafter with reference to FIG. 17.

The controller (110 of FIG. 1) may output the chip selection signal CS (having a logic "high" level) and the first to fifth command/address signals CA<1:5> having a second logic level combination after outputting the clock signal CLK as well as the chip selection signal CS (having a logic "high" level) and the first to fifth command/address signals CA<1:5> having a first logic level combination for performing the write operation. In addition, the controller 110 may output the sixth command/address signal CA<6> having a logic "low" level for performing the first burst operation.

The internal clock generation circuit 201 may receive the clock signal CLK to generate the internal clock signal ICLK and the inverted internal clock signal ICLKB.

The command/address input circuit 202 may buffer the chip selection signal CS in synchronization with the internal clock signal ICLK to generate the internal chip selection signal ICS. The command/address input circuit 202 may buffer the first to fifth command/address signals CA<1:5> in synchronization with the internal clock signal ICLK to generate the first to fifth internal command/address signals ICA<1:5>. The command/address input circuit 202 may buffer the sixth command/address signal CA<6> in synchronization with the internal clock signal ICLK to generate the burst control signal BL32 having a logic "low(L)" level.

The command decoder 211 may generate the write command pulse EWT having a logic "high(H)" level for performing the write operation based on the internal chip selection signal ICS (having a logic "high" level) and the first to fifth internal command/address signals ICA<1:5> having the first logic level combination. The command control circuit 203 may generate the first write control signal WT_BL16 having a logic "high" level for performing the first burst operation based on the internal chip selection signal ICS and the first to fifth internal command/address signals ICA<1:5>. The command control circuit 203 may generate the second write control signal WT_BL32 having a logic "low(L)" level based on the internal chip selection signal ICS and the first to fifth internal command/address signals ICA<1:5>.

The column control circuit 204 may generate the first write enablement signal WEN16, which is enabled to have a logic "high(H)" level for performing the first burst operation during the write operation, based on the write command pulse EWT having a logic "high(H)" level and the first write control signal WT_BL16 having a logic "high(H)" level. The column control circuit 204 may generate the second write enablement signal WEN32, which is disabled to have a logic "low(L)" level, based on the burst control signal BL32 having a logic "low" level.

The internal address generation circuit 205 may be synchronized with the internal clock signal ICLK to generate the first to $N^{th}$ internal address signals IADD<1:N> from the first to sixth internal command/address signals ICA<1:6>.

The data I/O circuit 206 may perform the first burst operation while the first write enablement signal WEN16 is enabled to have a logic "high(H)" level, thereby generating the first to $M^{th}$ internal data ID<1:M> from the first to $M^{th}$ data DATA<1:M>.

The core circuit 207 may store the first to $M^{th}$ internal data ID<1:M> into memory cells (not shown) which are selected by the first to $N^{th}$ internal address signals IADD<1:N>.

Figure 18:
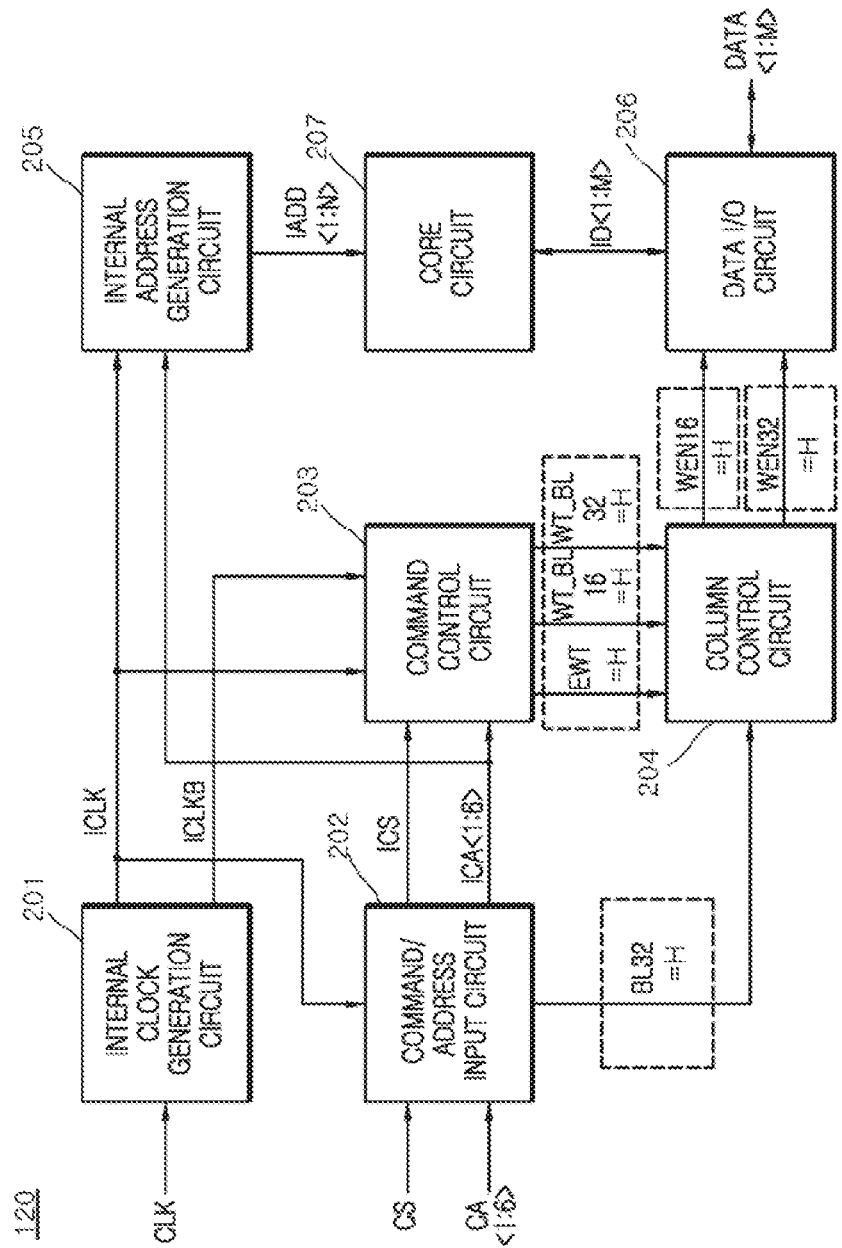

An operation for performing the second burst operation during the write operation of the electronic device 100 according to an embodiment of the present disclosure will be described hereinafter with reference to FIG. 18.

The controller (110 of FIG. 1) may output the chip selection signal CS (having a logic "high" level) and the first to fifth command/address signals CA<1:5> having a second logic level combination after outputting the clock signal CLK as well as the chip selection signal CS (having a logic "high" level) and the first to fifth command/address signals CA<1:5> having a first logic level combination for performing the write operation. In addition, the controller 110 may output the sixth command/address signal CA<6> having a logic "high" level for performing the second burst operation.

The internal clock generation circuit 201 may receive the clock signal CLK to generate the internal clock signal ICLK and the inverted internal clock signal ICLKB.

The command/address input circuit 202 may buffer the chip selection signal CS in synchronization with the internal clock signal ICLK to generate the internal chip selection signal ICS. The command/address input circuit 202 may buffer the first to fifth command/address signals CA<1:5> in synchronization with the internal clock signal ICLK to generate the first to fifth internal command/address signals ICA<1:5>. The command/address input circuit 202 may buffer the sixth command/address signal CA<6> in synchronization with the internal clock signal ICLK to generate the burst control signal BL32 having a logic "high(H)" level.

The command decoder 211 may generate the write command pulse EWT having a logic "high(H)" level for performing the write operation based on the internal chip selection signal ICS (having a logic "high" level) and the first to fifth internal command/address signals ICA<1:5> having the first logic level combination. The command control circuit 203 may generate the first write control signal WT_BL16 having a logic "high(H)" level for performing the first burst operation based on the internal chip selection signal ICS and the first to fifth internal command/address signals ICA<1:5>. The command control circuit 203 may generate the second write control signal WT_BL32 having a logic "high(H)" level based on the internal chip selection signal ICS and the first to fifth internal command/address signals ICA<1:5>.

The column control circuit 204 may generate the first write enablement signal WEN16, which is enabled to have a logic "high(H)" level for performing the first burst operation during the write operation, based on the write command pulse EWT having a logic "high(H)" level and the first write control signal WT_BL16 having a logic "high(H)" level. The column control circuit 204 may generate the second write enablement signal WEN32, which is enabled to have a logic "high(H)" level, based on the burst control signal BL32 having a logic "high(H)" level and the write flag signal WTF having a logic "high(H)" level.

The internal address generation circuit 205 may be synchronized with the internal clock signal ICLK to generate the first to $N^{th}$ internal address signals IADD<1:N> from the first to sixth internal command/address signals ICA<1:6>.

The data I/O circuit 206 may perform the first burst operation while the first write enablement signal WEN16 is enabled to have a logic "high" level, thereby generating the first to $M^{th}$ internal data ID<1:M> from the first to $M^{th}$ data DATA<1:M>. Thereafter, the data I/O circuit 206 may perform the second burst operation while the second write enablement signal WEN32 is enabled to have a logic "high" level, thereby generating the first to $M^{th}$ internal data ID<1:M> from the data DATA<1:M>.

The core circuit 207 may store the first to $M^{th}$ internal data ID<1:M> generated during the first burst operation into memory cells (not shown) which are selected by the first to $N^{th}$ internal address signals IADD<1:N>. Thereafter, the core circuit 207 may store the first to M$^{th}$ internal data ID<1:M> generated during the second burst operation into memory cells (not shown) which are selected by the first to N$^{th}$ internal address signals IADD<1:N>.

As described above, an electronic device according to an embodiment may set enablement periods of signals for performing a first burst operation and a second burst operation based on a chip selection signal and a command/address signal which are successively input in synchronization with a clock signal. Accordingly, it may be possible to reduce power consumption of the electronic device.

Figure 19:
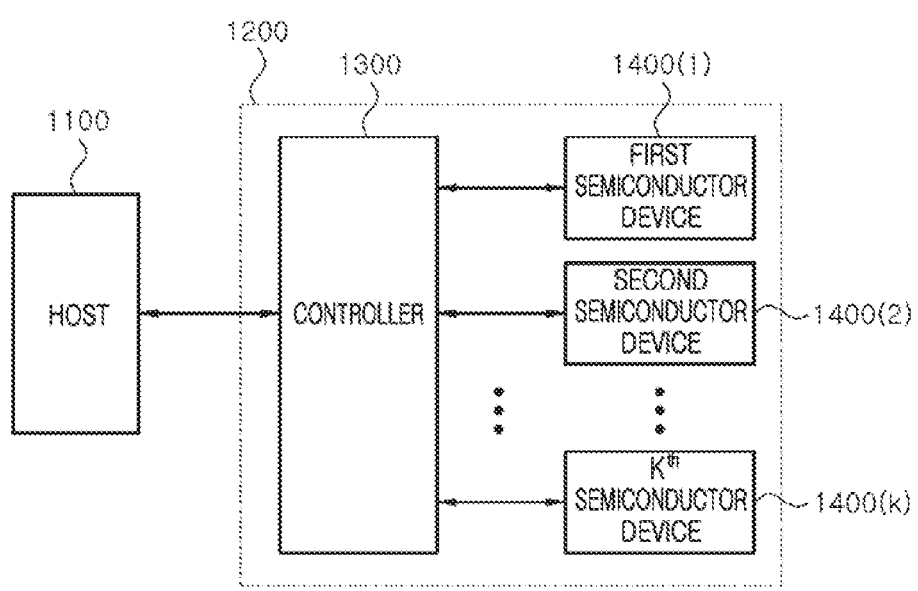
FIG. 19 is a block diagram illustrating a configuration of an electronic system employing the electronic device illustrated in FIGS. 1 to 18.

FIG. 19 is a block diagram illustrating a configuration of an electronic system 1000 according to an embodiment of the present disclosure. As illustrated in FIG. 19, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the write operation. The controller 1300 may control the semiconductor devices 1400(K:1) such that the semiconductor devices 1400(K:1) perform the first burst operation and the second burst operation during the write operation. Each of the semiconductor devices 1400(K:1) may set enablement periods of signals for performing the first burst operation and the second burst operation based on a chip selection signal and a command/address signal which are successively input in synchronization with the clock signal. Accordingly, it may be possible to reduce power consumption of the semiconductor system 1200.

The controller 1300 may be realized using the controllers 110 illustrated in FIG. 1. Each of the semiconductor devices 1400(K:1) may be realized using the semiconductor devices 120 illustrated in FIG. 1. In some embodiments, the semiconductor device 120 may be realized using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. An electronic device comprising:
a controller configured to output a clock signal and data and configured to successively output a chip selection signal and a command and address (command/address) signal for performing a write operation; and
a semiconductor device configured to enter the write operation based on the chip selection signal and the command/address signal which are input in synchronization with the clock signal at a first point in time and configured to selectively perform one of a first burst operation and a second burst operation during the write operation based on the chip selection signal and the command/address signal which are input in synchronization with the clock signal at a second point in time to store the data into the semiconductor device.

2. The electronic device of claim 1, wherein one of the first burst operation and the second burst operation is selectively performed according to a logic level of a burst control signal which is input through the command/address signal.

3. The electronic device of claim 1, wherein the number of bits included in the data stored during the second burst operation is "2×N" times the number of bits included in the data stored during the first burst operation (where, "N" is a natural number).

4. The electronic device of claim 1, wherein the semiconductor device includes:
a command/address input circuit configured to receive an internal clock signal generated from the clock signal to, in synchronization with the internal clock signal, generate an internal chip selection signal and an internal command/address signal from the chip selection signal and the command/address signal and to, in synchronization with the internal clock signal, generate a burst control signal from a bit signal included in the command/address signal;
a command control circuit configured to generate a write command pulse when the internal command/address signal has a first logic level combination while the internal chip selection signal is input and configured to generate a first write control signal and a second write control signal when the internal command/address signal has a second logic level combination while the internal chip selection signal is input; and
a column control circuit configured to generate a first write enablement signal which is enabled during the write operation based on the write command pulse and the first write control signal and configured to generate a second write enablement signal which is selectively enabled during the write operation based on the burst control signal, the write command pulse, and the second write control signal.

5. The electronic device of claim 4, wherein the command control circuit includes:
a command decoder configured to decode the internal chip selection signal and the internal command/address signal to generate the write command pulse and an operation control command pulse, one of which is selectively enabled;
a command shift circuit configured to receive the internal clock signal and an inverted internal clock signal corresponding to an inverted signal of the internal clock signal to, in synchronization with the internal clock signal and the inverted internal clock signal, generate a shift command from the write command pulse and the operation control command pulse; and
a burst control circuit configured to shift the shift command in synchronization with the internal clock signal to generate the first write control signal and configured to shift the first write control signal in synchronization with the internal clock signal during an enablement period of the second write enablement signal to generate the second write control signal.

6. The electronic device of claim 5,
wherein the command shift circuit is configured to latch the write command pulse in synchronization with the inverted internal clock signal; and
wherein the command shift circuit is configured to shift the latched write command pulse in synchronization with the internal clock signal to generate the shift command while the operation control command pulse is generated.

7. The electronic device of claim 5, wherein the burst control circuit includes:
a first write shift circuit configured to shift the shift command by a period for performing the first burst operation in synchronization with the internal clock signal to generate a write flag signal and the first write control signal which are sequentially enabled; and
a second write shift circuit configured to shift the first write control signal by a period for performing the second burst operation in synchronization with the internal clock signal during an enablement period of the second write enablement signal to generate the second write control signal.

8. The electronic device of claim 4, wherein the column control circuit includes:
a first counter configured to generate a write count signal, the write count signal is counted by the same number of times as the write command pulse is input to the first counter;
a second counter configured to generate an internal write count signal, the internal write count signal is counted by the same number of times as the first write control signal is input to the second counter;
a comparison circuit configured to generate a reset signal, the reset signal is enabled when the number of times that the write count signal is counted is equal to the number of times that the internal write count signal is counted; and
an enablement signal generation circuit configured to generate the first write enablement signal, the first write enablement signal is enabled by the write command pulse and the first write enablement signal is disabled by the first write control signal and the reset signal, and the enablement signal generation circuit is configured to generate the second write enablement signal, the second write enablement signal is enabled by a write flag signal and the burst control signal and the second write enablement signal is disabled by the second write control signal.

9. The electronic device of claim 8, wherein the enablement signal generation circuit includes:
a first enablement signal generation circuit configured to generate the first write enablement signal, the first write enablement signal is enabled at a point in time when the write command pulse is input to the first enablement signal generation circuit and the first write enablement signal is disabled at a point in time when the first write control signal and the reset signal are enabled; and
a second enablement signal generation circuit configured to generate the second write enablement signal, the second write enablement signal is enabled while the write flag signal and the burst control signal are enabled and the second write enablement signal is disabled at a point in time when the second write control signal is input to the second enablement signal generation circuit.

10. The electronic device of claim 9, wherein the first enablement signal generation circuit includes:
a write delay signal generation circuit configured to generate a write delay signal, the write delay signal is enabled after an internal delay time elapses from a point in time when the first write control signal is input to the write delay signal generation circuit while the reset signal is enabled; and
a first drive circuit configured to generate the first write enablement signal, the first write enablement signal is enabled at a point in time when the write command pulse is input to the first drive circuit and the first write enablement signal is disabled at a point in time when the write delay signal is input to the first drive circuit.

11. The electronic device of claim 9, wherein the second enablement signal generation circuit includes:
a pull-up and pull-down (pull-up/pull-down) signal generation circuit configured to generate a pull-up signal, the pull-up signal is enabled at a point in time when the second write control signal is input to the pull-up/pull-down signal generation circuit and the pull-up/pull-down signal generation circuit is configured to generate a pull-down signal, the pull-down signal is enabled while the write flag signal and the burst control signal are enabled; and
a second drive circuit configured to generate the second write enablement signal, the second write enablement signal is enabled at a point in time when the pull-down signal is input to the second drive circuit and the second write enablement signal is disabled at a point in time when the pull-up signal is input to the second drive circuit.

12. The electronic device of claim 4, wherein the semiconductor device further comprising:
an internal address generation circuit configured to receive the internal clock signal to, in synchronization with the internal clock signal, generate an internal address from the internal command/address signal while the internal chip selection signal is not generated;
a data input and output (input/output) circuit configured to perform the first burst operation during an enablement period of the first write enablement signal to generate internal data from the data and configured to perform the second burst operation during an enablement period of the second write enablement signal to generate the internal data from the data; and
a core circuit configured to store the internal data based on the internal address.

13. An electronic device comprising:
a command control circuit configured to receive an internal chip selection signal and an internal command and address (command/address) signal to generate a write command pulse for performing a write operation, a first write control signal for performing a first burst operation, and a second write control signal for performing a second burst operation; and
a column control circuit configured to generate a first write enablement signal which is enabled during the write operation based on the write command pulse and the first write control signal and configured to generate a second write enablement signal which is selectively enabled during the write operation based on the write command pulse and the second write control signal.

14. The electronic device of claim 13, wherein the command control circuit is configured to generate the write command pulse when the internal chip selection signal and the internal command/address signal have a first logic level combination.

15. The electronic device of claim 13, wherein when the internal chip selection signal and the internal command/address signal have a second logic level combination, the command control circuit is configured to shift the write command pulse by a period for performing the first burst operation to generate the first write control signal and is configured to shift the first write control signal by a period for performing the second burst operation to generate the second write control signal.

16. The electronic device of claim 13, wherein the second burst operation is an operation for storing data including a plurality of bits, the number of which is "2×N" times the number of bits included in data stored during the first burst operation (where, "N" is a natural number).

17. The electronic device of claim 13, wherein the command control circuit includes:
   a command decoder configured to decode the internal chip selection signal and the internal command/address signal to generate the write command pulse and an operation control command pulse, one of which is selectively enabled;
   a command shift circuit configured to receive an internal clock signal and an inverted internal clock signal to generate, in synchronization with the internal clock signal and the inverted internal dock signal, a shift command from the write command pulse and the operation control command pulse; and
   a burst control circuit configured to shift the shift command in synchronization with the internal clock signal to generate the first write control signal and configured to shift the first write control signal in synchronization with the internal clock signal during an enablement period of the second write enablement signal to generate the second write control signal.

18. The electronic device of claim 17,
   wherein the command shift circuit is configured to latch the write command pulse in synchronization with the inverted internal clock signal; and
   wherein the command shift circuit is configured to shift the latched write command pulse in synchronization with the internal clock signal to generate the shift command while the operation control command pulse is generated.

19. The electronic device of claim 17, wherein the burst control circuit includes:
   a first write shift circuit configured to shift the shift command by a period for performing the first burst operation in synchronization with the internal clock signal to generate a write flag signal and the first write control signal which are sequentially enabled; and
   a second write shift circuit configured to shift the first write control signal by a period for performing the second burst operation in synchronization with the internal clock signal during an enablement period of the second write enablement signal to generate the second write control signal.

20. The electronic device of claim 13, wherein the column control circuit includes:
   a first counter configured to generate a write count signal, the write count signal is counted by the same number of times as the write command pulse is input to the first counter;
   a second counter configured to generate an internal write count signal, the internal write count signal is counted by the same number of times as the first write control signal is input to the second counter;
   a comparison circuit configured to generate a reset signal, the reset signal is enabled when the number of times that the write count signal is counted is equal to the number of times that the internal write count signal is counted; and an enablement signal generation circuit configured to generate the first write enablement signal, the first write enablement signal is enabled by the write command pulse and the first write enablement signal is disabled by the first write control signal and the reset signal, and the enablement signal generation circuit is configured to generate the second write enablement signal, the second write enablement signal is enabled by a write flag signal and a burst control signal and the second write enablement signal is disabled by the second write control signal.

21. The electronic device of claim 20, wherein the enablement signal generation circuit includes:
   a first enablement signal generation circuit configured to generate the first write enablement signal, the first write enablement signal is enabled at a point in time when the write command pulse is input to the first enablement signal generation circuit and is the first write enablement signal disabled at a point in time when the first write control signal and the reset signal are enabled; and
   a second enablement signal generation circuit configured to generate the second write enablement signal, the second write enablement signal is enabled while the write flag signal and the burst control signal are enabled and the second write enablement signal is disabled at a point in time when the second write control signal is input to the second enablement signal generation circuit.

22. The electronic device of claim 21, wherein the first enablement signal generation circuit includes:
   a write delay signal generation circuit configured to generate a write delay signal, the write delay signal is enabled after an internal delay time elapses from a point in time when the first write control signal is input to the write delay signal generation circuit while the reset signal is enabled; and
   a first drive circuit configured to generate the first write enablement signal, the first write enablement signal is enabled at a point in time when the write command pulse is input to the first drive circuit and the first write enablement signal is disabled at a point in time when the write delay signal is input to the first drive circuit.

23. The electronic device of claim 21, wherein the second enablement signal generation circuit includes:
   a pull-up and pull-down (pull-up/pull-down) signal generation circuit configured to generate a pull-up signal, the pull-up signal is enabled at a point in time when the second write control signal is input to the pull-up/pull-down signal generation circuit and the pull-up/pull-down signal generation circuit is configured to generate a pull-down signal, the pull-down signal is enabled while the write flag signal and the burst control signal are enabled; and
   a second drive circuit configured to generate the second write enablement signal, the second write enablement signal is enabled at a point in time when the pull-down signal is input to the second drive circuit and the second write enablement signal is disabled at a point in time when the pull-up signal is input to the second drive circuit.

* * * * *